United States Patent [19]
Fekete et al.

[11] Patent Number: 5,831,827
[45] Date of Patent: Nov. 3, 1998

[54] TOKEN SHAPED MODULE FOR HOUSING AN ELECTRONIC CIRCUIT

[75] Inventors: Nicholas M. G. Fekete, Richardson; Elaine J. Gattenby, Allen; Michael L. Bolan, Dallas, all of Tex.

[73] Assignee: Dallas Semiconductor Corporation, Dallas, Tex.

[21] Appl. No.: 806,392

[22] Filed: Feb. 26, 1997

Related U.S. Application Data

[63] Continuation of Ser. No. 234,210, Apr. 28, 1994, abandoned.

[51] Int. Cl.$^6$ .............................. H02G 3/08; H01L 23/17; H05K 7/00
[52] U.S. Cl. ......................... 361/728; 174/52.1; 257/731; 361/807; 361/809; 361/820
[58] Field of Search ................................ 174/52.1, 52.4; 206/701, 710; 220/4.01, 4.21, 4.24, 324, 326; 257/678, 699, 704, 708, 709, 728, 729, 730, 732, 731; 361/728, 732, 735, 737, 740, 747, 752, 807, 809, 810, 820; 429/96–100; 235/387, 388, 492, 493; 437/209

[56] References Cited

U.S. PATENT DOCUMENTS

| | | | |
|---|---|---|---|
| 3,059,157 | 10/1962 | English et al. | 257/731 |
| 3,142,783 | 7/1964 | Warren et al. | 174/52.6 |
| 3,231,795 | 1/1966 | Steinhelper, Jr. | 257/727 |
| 3,249,982 | 5/1966 | Couvering et al. | 437/209 |

(List continued on next page.)

FOREIGN PATENT DOCUMENTS

| | | |
|---|---|---|
| 0147099 | 3/1985 | European Pat. Off. . |
| 5267674 | 6/1977 | Japan . |
| 62-125659 | 6/1987 | Japan . |
| 63-190374 | 8/1988 | Japan . |

OTHER PUBLICATIONS

Sedra, Adel S. and Smith, Kenneth c., Microelectronic Circuits, 1982, p. 358.
Aoki, et al, FAM 16.1: A.1.5.Y DRAM for Battery–Based Applications, 1989 IEEE, International Solid–State Circuits Conference Digest of Technical Papers, pp. 238, 239, 4349.
IBM Tech. Disc. Bul. vol. 19, No. 8 Jan. 1972 "Bouncing Switch Output to Single–Pulse Converter in 4–phase logic" Radzik 307 542.1.

*Primary Examiner*—Donald Sparks
*Attorney, Agent, or Firm*—Jenkens & Gilchrist

[57] ABSTRACT

A module houses electronic circuitry that comprises a first electrically conductive surface area and a second electrically conductive surface. The first and second electrically conductive surfaces combine to form a substantially token-shaped body. The body has a groove positioned around its perimeter. A probe that has a first end and a second end. A conductive, approximately pointed tip that extends from the first end of the probe and a conductive sleeve extends outward from pointed tip from a location proximate to said first end to a second distance. A first electrical connection contacts the tip and extends from the first end through the probe out the second end. A second electrical connection contacts the sleeve and extends from the first end through the probe out from the second end. A housing that holds an electronic module. The electronic module has a first surface and a second surface. The housing comprises a first end and a second end; and a hole positioned in the first end that allows an electronic module to be inserted therethrough. An electronic module connector that is shaped to receive an electronic module comprises a first conductive surface positioned on the perimeter of the electronic module connector, the first surface raised, a second conductive surface that extends horizontally at an angle to the first surface. A bracelet for housing an electronic module that has a first conductive surface and a second conductive surface and comprises a housing to hold an electronic module so that the first and second conductive surfaces can be contacted from outside and a band that is mechanically coupled to the housing.

8 Claims, 32 Drawing Sheets

U.S. PATENT DOCUMENTS

| | | |
|---|---|---|
| 3,335,327 | 8/1967 | Damon et al. . |
| 3,440,496 | 4/1969 | Saia et al. ................ 174/52.6 |
| 3,502,905 | 3/1970 | Bicking ..................... 307/570 |
| 3,846,971 | 11/1974 | Ho et al. ................... 368/88 |
| 3,859,638 | 1/1975 | Hume, Jr. .................. 365/229 |
| 3,986,051 | 10/1976 | Okada et al. .............. 307/296.1 |
| 3,996,735 | 12/1976 | Zurcher .................... 368/88 |
| 4,007,355 | 2/1977 | Moreno ..................... 235/492 |
| 4,048,478 | 9/1977 | Miwa et al. ................ 377/15 |
| 4,053,688 | 10/1977 | Perkins et al. ............. 368/88 |
| 4,064,689 | 12/1977 | Yasuda et al. ............. 368/88 |
| 4,084,236 | 4/1978 | Chelberg et al. ........... 364/800 |
| 4,086,752 | 5/1978 | Kishimoto ................. 368/88 |
| 4,140,930 | 2/1979 | Tanaka ..................... 307/272.3 |
| 4,142,114 | 2/1979 | Green ....................... 307/296.8 |
| 4,168,531 | 9/1979 | Eichelberger et al. ...... 377/26 |
| 4,169,642 | 10/1979 | Mouissie . |
| 4,196,577 | 4/1980 | Ohno et al. ................ 368/82 |
| 4,211,919 | 7/1980 | Ugon ........................ 235/488 |
| 4,239,558 | 12/1980 | Morishita et al. ........... 148/175 |
| 4,272,838 | 6/1981 | Kasama et al. ............. 368/88 |
| 4,363,125 | 12/1982 | Brewer et al. .............. 371/71 |
| 4,399,524 | 8/1983 | Mugurama ................ 365/229 |
| 4,400,711 | 8/1983 | Avery . |
| 4,426,159 | 1/1984 | Kosaka et al. ............. 368/88 |
| 4,442,345 | 4/1984 | Mollieric et al. ............ 235/380 |
| 4,459,607 | 7/1984 | Reid .......................... 235/492 M |
| 4,471,345 | 9/1984 | Barrett, Jr. ................. 340/825.32 X |
| 4,473,825 | 9/1984 | Walton ..................... 340/825.54 |
| 4,475,178 | 10/1984 | Kinoshika ................. 365/203 |
| 4,480,178 | 10/1984 | Miller et al. ................ 235/380 |
| 4,486,770 | 12/1984 | Woodward . |
| 4,511,796 | 4/1985 | Aigo ......................... 235/492 |
| 4,514,785 | 4/1985 | Parmantiger .............. 235/492 M |
| 4,531,064 | 7/1985 | Levine ...................... 377/32 |
| 4,539,472 | 9/1985 | Pobtkar et al. ............. 235/488 |
| 4,546,455 | 10/1985 | Iwahastic et al. .......... 365/200 |
| 4,556,958 | 12/1985 | Ugon ........................ 235/492 X |
| 4,556,959 | 12/1985 | Ugon ........................ 395/575 |
| 4,583,111 | 4/1986 | Early ........................ 307/303.2 |
| 4,595,941 | 6/1986 | Avery . |
| 4,616,343 | 10/1986 | Ogawa ..................... 365/203 |
| 4,617,473 | 10/1986 | Bingham .................. 365/203 |
| 4,618,857 | 10/1986 | Dubois et al. ............. 307/66 |
| 4,621,190 | 11/1986 | Saito et al. ................ 235/492 |
| 4,631,567 | 12/1986 | Kokado et al. . |
| 4,642,667 | 2/1987 | Magee . |
| 4,645,943 | 2/1987 | Smith, Jr. et al. .......... 307/150 |
| 4,658,352 | 4/1987 | Nagasawa ................. 364/200 |
| 4,682,829 | 7/1987 | Kunkle et al. ............. 439/70 X |
| 4,683,372 | 7/1987 | Matsumoto ............... 235/492 |
| 4,688,036 | 8/1987 | Hirano et al. .............. 340/825.54 X |
| 4,691,202 | 9/1987 | Dume et al. ............... 340/825.54 |
| 4,709,202 | 11/1987 | Koenck et al. ............. 340/636 |
| 4,713,555 | 12/1987 | Lee .......................... 307/66 |
| 4,717,817 | 1/1988 | Grass ....................... 235/441 |
| 4,724,427 | 2/1988 | Carroll . |
| 4,730,121 | 3/1988 | Lee et al. .................. 307/66 |
| 4,742,215 | 5/1988 | Daughters et al. ......... 235/487 |
| 4,742,470 | 5/1988 | Jueugel .................... 340/825.54 X |
| 4,748,320 | 5/1988 | Yorimoto et al. .......... 235/492 |
| 4,767,918 | 8/1988 | Kushima et al. ........... 235/441 |
| 4,780,707 | 10/1988 | Selker ...................... 235/472 |
| 4,800,590 | 1/1989 | Vaughan ................... 380/25 |
| 4,809,221 | 2/1989 | Magliocco et al. ........ 377/44 |
| 4,810,975 | 3/1989 | Dias ......................... 331/78 |
| 4,815,112 | 3/1989 | Kuze ........................ 377/26 |
| 4,816,656 | 3/1989 | Nakano et al. ............. 235/380 |
| 4,827,478 | 5/1989 | Chan ........................ 371/38 |
| 4,833,350 | 5/1989 | Frisch ...................... 307/475 |
| 4,845,351 | 7/1989 | Hara et al. ................ 235/492 |
| 4,845,609 | 7/1989 | Lighthurt et al. .......... 395/425 |
| 4,853,560 | 8/1989 | Iwamura et al. ........... 307/475 X |
| 4,855,690 | 8/1989 | Dias ......................... 331/78 |
| 4,855,803 | 8/1989 | Azumai et al. ............ 365/96 X |
| 4,862,310 | 8/1989 | Harrington, III . |
| 4,862,501 | 8/1989 | Kamitake et al. .......... 380/50 |
| 4,868,409 | 9/1989 | Tanaka et al. ............. 70/278 |
| 4,870,401 | 9/1989 | Lee et al. .................. 340/825.31 |
| 4,871,982 | 10/1989 | Williams et al. ........... 331/75 |
| 4,874,965 | 10/1989 | Compardo et al. ........ 307/279 |
| 4,878,220 | 10/1989 | Hashimoto ............... 371/40.1 |
| 4,882,474 | 11/1989 | Anderl et al. ............. 235/492 |
| 4,885,788 | 12/1989 | Takaragi et al. ........... 380/23 |
| 4,887,234 | 12/1989 | Iijima ....................... 395/425 |
| 4,887,292 | 12/1989 | Barrett et al. ............. 379/103 |
| 4,897,564 | 1/1990 | Chen ........................ 307/475 |
| 4,902,237 | 2/1990 | Heutson . |
| 4,908,790 | 3/1990 | Little et al. ................ 365/229 |
| 4,912,435 | 3/1990 | Williams et al. ........... 331/75 |
| 4,928,000 | 5/1990 | Eglise et al. ............... 235/380 |
| 4,928,001 | 5/1990 | Masada ..................... 235/380 |
| 4,935,899 | 6/1990 | Morigami ................. 365/200 |
| 4,943,804 | 7/1990 | Lee et al. .................. 340/825.34 |
| 4,945,217 | 7/1990 | Bolan ....................... 235/492 M |
| 4,947,163 | 8/1990 | Henderson et al. ........ 340/825.31 |
| 4,948,954 | 8/1990 | Dias ......................... 235/492 |
| 4,967,108 | 10/1990 | Lee et al. .................. 307/556 |
| 4,970,408 | 11/1990 | Hanke et al. .............. 307/272.3 |
| 4,980,746 | 12/1990 | Harrington, III . |
| 4,982,371 | 1/1991 | Bolan et al. ............... 365/228 |
| 4,982,892 | 1/1991 | Darla et al. ............... 174/261 X |
| 4,984,291 | 1/1991 | Dias et al. ................. 455/343 |
| 4,988,987 | 1/1991 | Barrett et al. ............. 340/825.21 |
| 4,989,261 | 1/1991 | Lee .......................... 455/127 |
| 4,995,004 | 2/1991 | Lee .......................... 365/189.11 |
| 5,010,331 | 4/1991 | Dias et al. ................. 340/825.31 |
| 5,013,898 | 5/1991 | Glasspool ................. 235/449 |
| 5,019,736 | 5/1991 | Furtek ...................... 307/303.2 |
| 5,027,008 | 6/1991 | Runaldue .................. 307/272.3 |
| 5,032,708 | 7/1991 | Comerford et al. ........ 235/492 |
| 5,038,299 | 8/1991 | Maeda ...................... 364/519 |
| 5,039,875 | 8/1991 | Chang ...................... 307/272.3 |
| 5,045,675 | 9/1991 | Curry ....................... 235/441 |
| 5,049,728 | 9/1991 | Rovin ....................... 235/492 |
| 5,051,897 | 9/1991 | Yamaguchi et al. ....... 364/800 |
| 5,111,058 | 5/1992 | Martin ...................... 365/229 |
| 5,121,359 | 6/1992 | Steele ....................... 365/229 |
| 5,151,622 | 9/1992 | Thrower et al. ........... 307/451 X |
| 5,177,742 | 1/1993 | Herzberger ................ 70/112 |
| 5,179,298 | 1/1993 | Hirano et al. .............. 307/443 |
| 5,276,367 | 1/1994 | Maekawa .................. 307/443 X |

5,831,827

TOKEN SHAPED MODULE FOR HOUSING AN ELECTRONIC CIRCUIT

This application is a continuation of application Ser. No. 08/234,210, filed on Apr. 28, 1994, now abandoned.

PARTIAL WAIVER OF COPYRIGHT PURSUANT TO 1077 O.G. 22(3/20/87)

(C) Copyright, Dallas Semiconductor Corporation 1994. All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO RELATED APPLICATIONS

This application hereby incorporates by reference the following co-assigned issued patents and patent applications, which describe in great detail the operation of the technology surrounding Touch Memory™ processes and systems, which was developed by employees at Dallas Semiconductor Corporation:

| U.S. Pat. No. | Issue Date | DSC Case No. | Authors |
| --- | --- | --- | --- |
| 4,862,310 | 04-29-88/08-29-89 | DSC-77 | Harrington |
| 5,210,846 | 05-15-89/05-11-93 | DSC-83 | Lee |
| 08/019,932 | 02-19-93 | DSC-83A | Lee |
| 4,982,371 | 05-15-89/01-01-91 | DSC-85 | Lee et al. |
| 07/632,227 | 12-20-90 | DSC-85A | Lee et al. |
| 5,091,771 | 05-15-89/11-18-91 | DSC-86 | Bolan et al. |
| 4,972,377 | 05-15-89/11-20-90 | DSC-107 | Lee |
| 5,191,554 | 08-27-91/03-02-93 | DSC-107A | Lee |
| 5,181,091 | 09-16-91/01-19-93 | DSC-153A | Harrington et al. |
| 4,945,217 | 05-15-89/07-31-90 | DSC-157 | Bolan |
| 5,025,141 | 07-17-90/06-18-91 | DSC-157A | Bolan |
| 4,948,954 | 05-15-89/08-14-90 | DSC-158 | Dias |
| 4,983,820 | 08-14-90/01-08-91 | DSC-158A | Dias |
| 5,045,675 | 05-15-89/09-03-91 | DSC-159 | Steve Curry |
| 4,995,004 | 05-15-89/02-19-91 | DSC-160 | Lee |
| 07/657,717 | 02-19-91 | DSC-160A | Lee |
| 07/725,793 | 07-09-91 | DSC-175 | Curry et al. |
| 07/998,978 | 12-30-92 | DSC-175A | Curry et al. |
| 07/527,492 | 05-22-90 | DSC-268 | Bolan et al. |
| 5,206,905 | 11-19-90/04-27-93 | DSC-303 | Lee et al. |
| 07/615,615 | 11-19-90 | DSC-304 | Lee et al. |
| 5,226,137 | 11-19-90/07-06-93 | DSC-305 | Lee et al. |
| 07/882,244 | 05-08-92 | DSC-306 | Lee |
| 07/631,929 | 12-19-90 | DSC-316 | Curry et al. |
| 07/728,230 | 07-10-91 | DSC-317 | Pearson et al. |
| 07/727,618 | 07-10-91 | DSC-319 | Williams et al. |
| 07/727,619 | 07-10-91 | DSC-322 | Rodriguez et al. |
| 07/727,638 | 07-10-91 | DSC-324 | Ni et al. |
| 08/103,724 | 08-09-93 | DSC-352 | Pearson et al. |
| 07/727,639 | 07-10-91 | DSC-353 | Bolan et al. |
| 5,166,545 | 07-10-91/11-24-92 | DSC-356 | Harrington |
| 08/022,258 | 02-24-93 | DSC-377 | Bolan et al. |
| 08/031,776 | 03-15-93 | DSC-377A | Bolan et al. |
| 08/015,506 | 02/09/93 | DSC-393 | Harrington et al. |

FIELD OF INVENTION

The present invention relates generally to mechanical systems and processes for portable electronic modules and, more particularly, but not by way of limitation, to Touch Memory™ products.

BACKGROUND

Modern packaging systems and processes for electronic components have not typically been very robust or versatile. In particular, modern packaging for electronic components is often fragile, expensive, cumbersome, and, for those reasons, not portable or adaptable to a large number of electrical systems.

SUMMARY OF THE INVENTIONS

The present invention relates to compact electronic modules and to components and packaging for use with such modules. The numerous innovations disclosed herein are believed to contribute a major advance in this direction.

Regarding the compact modules, the modules comprise a first conductive surface and a second conductive surface that when combined form a cavity capable of housing electronic circuitry. The first and second conductive surfaces are preferably concave in structure and have a groove positioned continuously around the perimeter of a raised upper lip. The sizes and limitations can be varied. A module that houses electronic circuitry that comprises a first electrically conductive surface area and a second electrically conductive surface. The first and second electrically conductive surfaces combine to form a substantially token-shaped body. The body having a a groove positioned around the perimeter of it. The first and second electrically conductive surface areas are electrically isolated from each other. The first electrically conductive surface comprises one flat face of the substantially token-shaped body and the second area comprises a second flat face parallel to the one flat face plus a portion of a curved surface which is perpendicular to the flat faces. Preferred embodiments of the substantially token-shaped body are button-shaped. First and second conductive surfaces are comprised of metal. A portion of the second conductive surface extends outward from the conductive surface and forms a flange, the flange extends around the perimeter of the substantially token-shaped body.

Regarding the probe, a sleeve apparatus is preferably positioned around a sharp point, so that when it contacts the compact module, a complete circuit is formed. In particular, the probe comprises a first end and a second end. A conductive, approximately pointed tip extends from the first end of the body to a first distance. A conductive sleeve extends outward from the pointed tip from a location proximate to the first end to a second distance. A first electrical connection contacts the tip and extends from the first end through the probe out a the second end. A second electrical connection contacts the sleeve and extends from the first end through the probe out of a second end. A rubberized gripping material is positioned on an outer surface of the probe.

Regarding the FOB assembly, it is now ergonomically fashioned to allow users to easily position and apply it to various receptacles (e.g., lock faces). In particular, preferred embodiments of the housing or FOB assembly hold an electronic module. The electronic module, as described above, preferably has a first surface and a second surface. The electronic module has a first end and a second end. The first end has a hole positioned therein that allows the electronic module to be inserted therethrough. The housing also has a first concave surface that allows a finder to easily be positioned therein. The second end has a hole positioned therein as well to allow a string or other similar device to be inserted therethrough.

Regarding the module connectors, the connectors are designed to secure and hold the compact modules discussed above. In particular, a first module connector comprises a raised upper lip with a curved end to rest in the groove or indentation described above in reference to the compact module. In addition, the first module connector is shaped in such a way that it can rest on a flat, printed circuit board or the like and allow electrical contacts (e.g., wires) to contact the module connector. Similarly, the second module connector is structured to exert a spring-like force against the electronic module, so that one surface of the electronic module is pressed against one surface of the electronic connector. In preferred embodiments, one conductive surface of the electronic module electrically contacts one module connector and similarly, another conductive surface of electronic module electrically contacts a second module connector. In general, preferred embodiments of the electronic module connector are shaped to receive an electronic module. A first conductive surface positioned on the perimeter of the electronic module connector. A second conductive surface extends horizontally at an angle to the first surface. The electronic module is a button- or coin-shaped token. As discussed above, the second surface of the electronic module has a flange that extends over the electronic module when the electronic module is positioned in the electronic module connector. A third conductive surface is electrically isolated from the first and second conductive surface and forms a spring that electrically contacts a first surface of the electronic module and exerts a force against the electronic module. The electronic module has a perimeter and a groove positioned around the perimeter of the electronic module that the curved portion rests within.

Regarding the bracelet and clips, both assemblies are structured to house and secure the compact electronic modules discussed above, so that they can be contacted by the module connectors, probes, etc. An electronic module clip comprises a body having a first end and a second end; and the first end having a first hole positioned therein that allows the electronic module to be inserted therethrough. The electronic module clip of also has at least one slot positioned therein. The bracelet for housing an electronic module comprises a housing to hold an electronic module so that the first and second conductive surfaces can be contacted from outside and a band that is mechanically coupled to the housing. The housing is preferably folded around the band. The housing comprises slots through which the band is weaved so that the band is mechanically coupled to the housing.

BRIEF DESCRIPTION OF THE DRAWINGS

Further features and advantages will become apparent from the following and more particular description of the various embodiments of the invention, as illustrated in the accompanying drawings, wherein.

DETAILED DESCRIPTION OF THE PREFERRED EMBODIMENTS

Figure 1A:
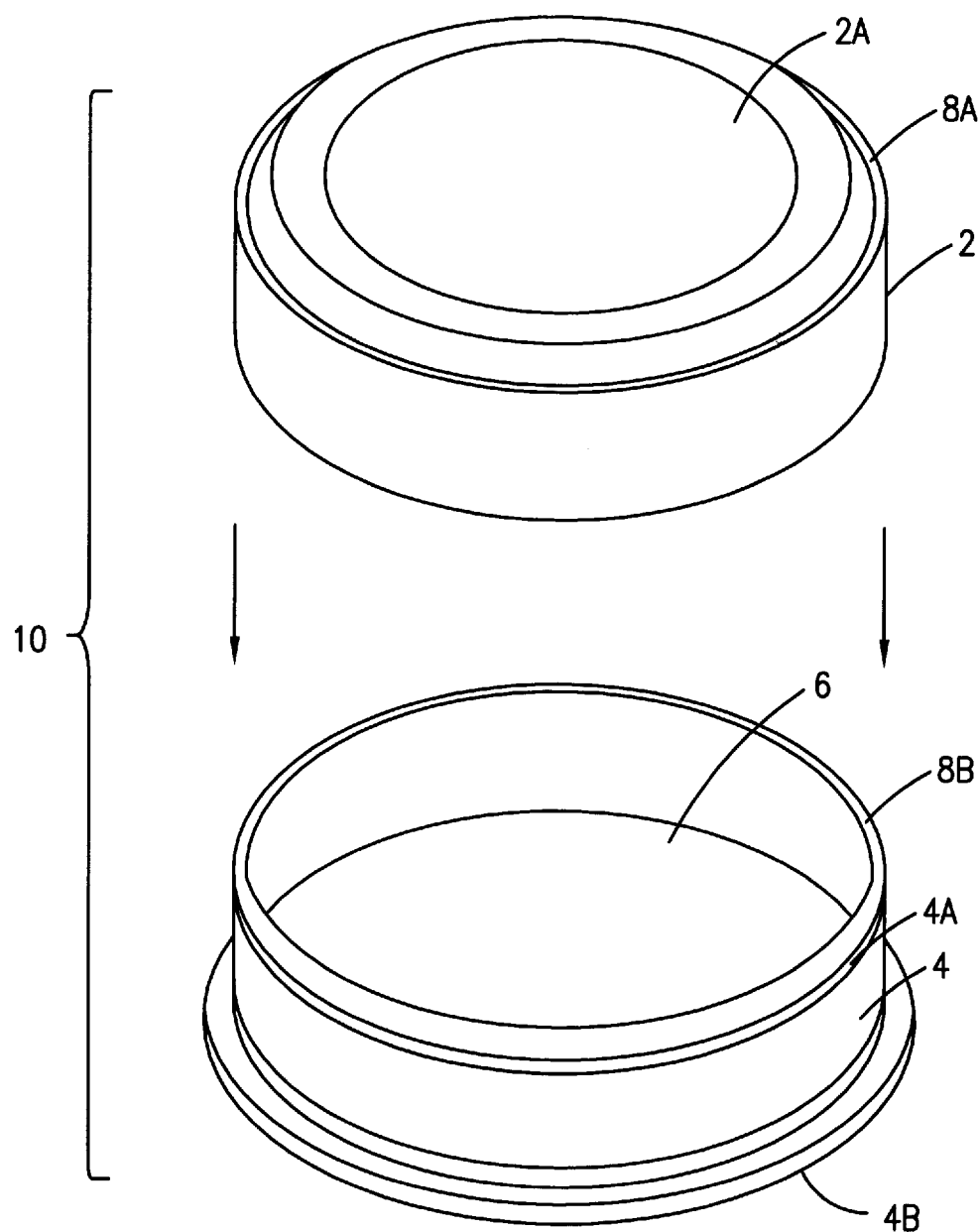
FIG. 1A is an exploded view of first conductive surface 2 (e.g., the "top" or "male" conductive surface) and second conductive surface 4 (e.g., the "bottom" or "female" conductive surface), positioned in such a fashion that when assembled in the manner shown in FIG. 1B form coin-shaped or button-shaped electronic module 10 (e.g., Touch Memory™ module)
Figure 1B:
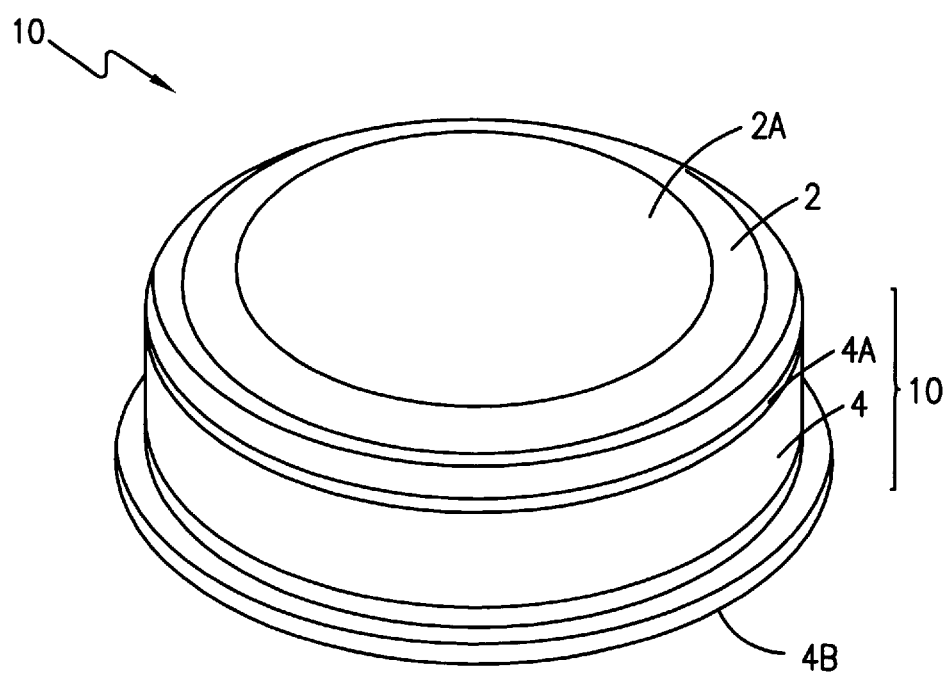
FIG. 1B is an isometric view of the first and second surfaces 2 and 4 of electronic module 10 when they are assembled together or crimped together to form coin or button-shaped electronic token, known as electronic module 10.
Figure 1C:
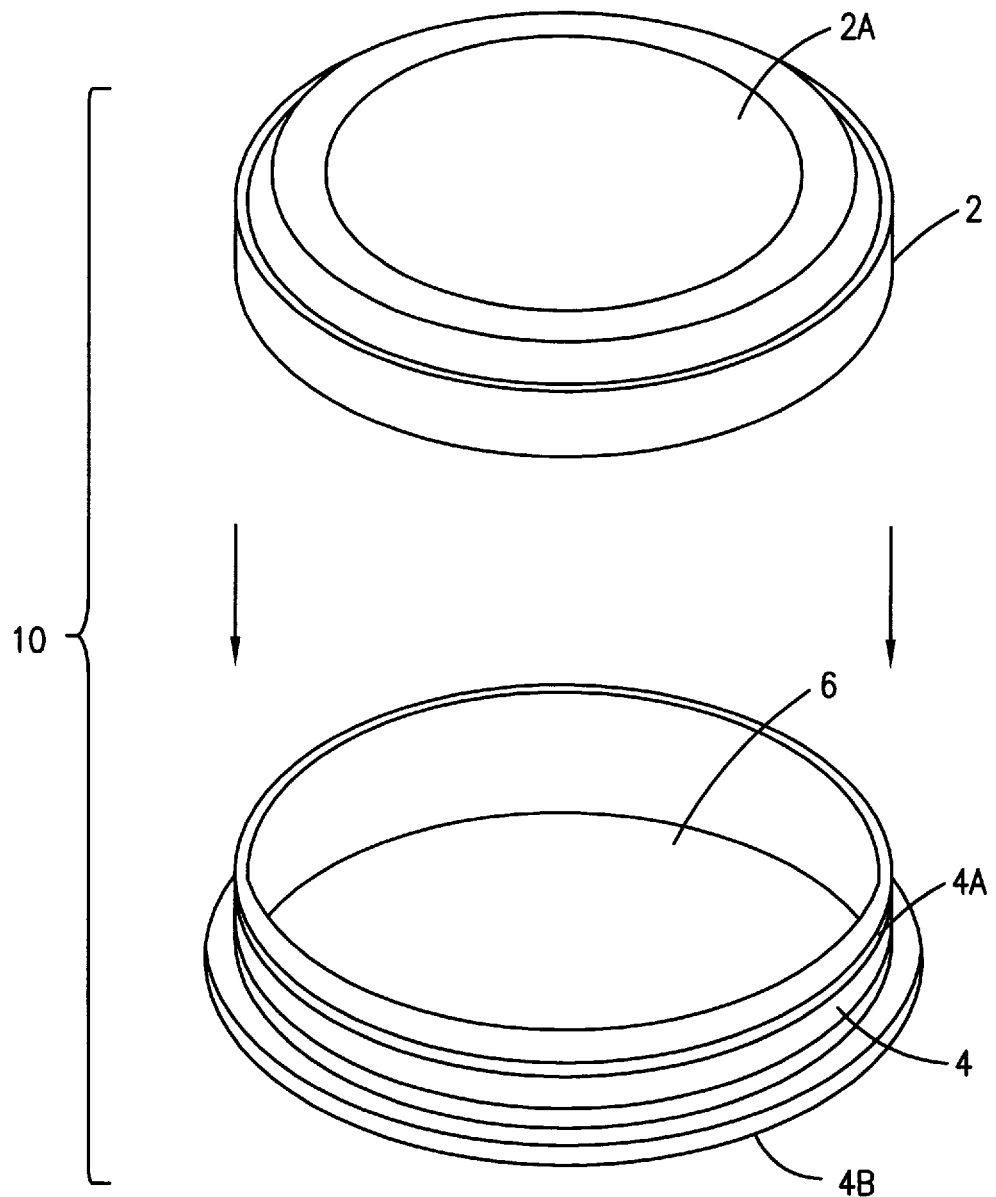
FIG. 1C is exploded view of first conductive surface 2 (e.g., the "top" or "male" conductive surface) and second conductive surface 4 (e.g., the "bottom" or "female" conductive surface), positioned in such a fashion that when assembled in the manner shown in FIG. 1D form coin-shaped or button-shaped electronic module 10 (e.g., Touch Memory™ module)

Regarding the shape of the coin-shaped or button-shaped electronic module 10 itself (e.g., parts DS1991, DS1992, etc., which are manufactured by Dallas Semiconductor Corporation), please refer generally to FIGS. 1A–1G. Referring to FIG. 1A, FIG. 1A is an exploded view of first conductive surface 2 (e.g., the "top" or "male" conductive surface) and second conductive surface 4 (e.g., the "bottom" or "female" conductive surface), positioned in such a fashion that when assembled in the manner shown in FIG. 1B form the coin-shaped or button-shaped electronic module 10 (e.g., Touch Memory™ module). More specifically, the first conductive surface 2 and the second conductive surface 4 are shaped such that they interact or "fit" together. More specifically, preferred system embodiments are shaped such that a first conductive surface 2 can actually fit inside a second conductive surface 4 in order to create a pocket or closed cavity therein. The electronic circuitry (e.g., Touch Memory™ circuitry described in the patents incorporated above, which, in turn, comprise memory, microprocessors, input/output circuitry, batteries, etc.), is preferably mounted on a small printed circuit board. The electronic circuitry is not shown in FIG. 1A, but is described in great detail in many of the incorporated references above. In general, it is preferably integrated into one or more integrated circuits on a single, monolithic piece of a semiconductor substrate (e.g. silicon) and packaged using common plastic encapsulation techniques and affixed and electrically coupled to a small printed circuit board. The circuitry positioned inside the electronic module 10 may or may not include a battery, depending upon the application and operating conditions. The circuitry is positioned in cavity 6, which is created by the first and second conductive surfaces 2 and 4. In addition, please note that insulator 9 (not shown in FIG. 1A—see FIG. 1H), which is preferably a sleeve that surrounds portions of first conductive surface 2 that may come in contact with second conductive surface 4, is positioned between portions of first conductive surface 2 positioned or located inside second conductive surface 4.

Figure 1D:
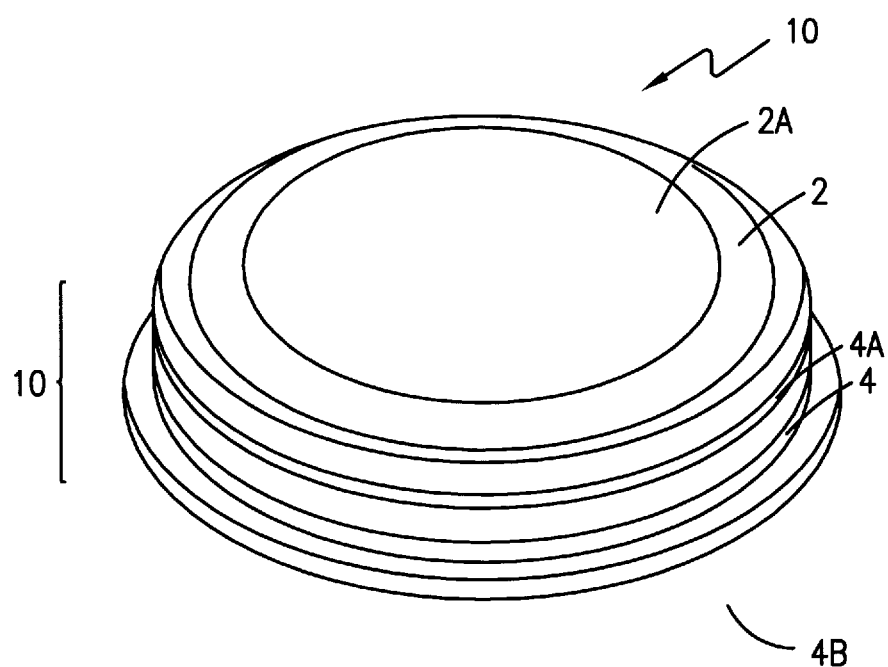
FIG. 1D is another isometric view of first and second conductive surfaces 2 and 4 interlocked or assembled to form the coin-shaped or button-shaped electronic module 10 having different dimensions than that coin- or button-shaped electronic module 10 shown in FIGS. 1A–1B.
Figure 1E:
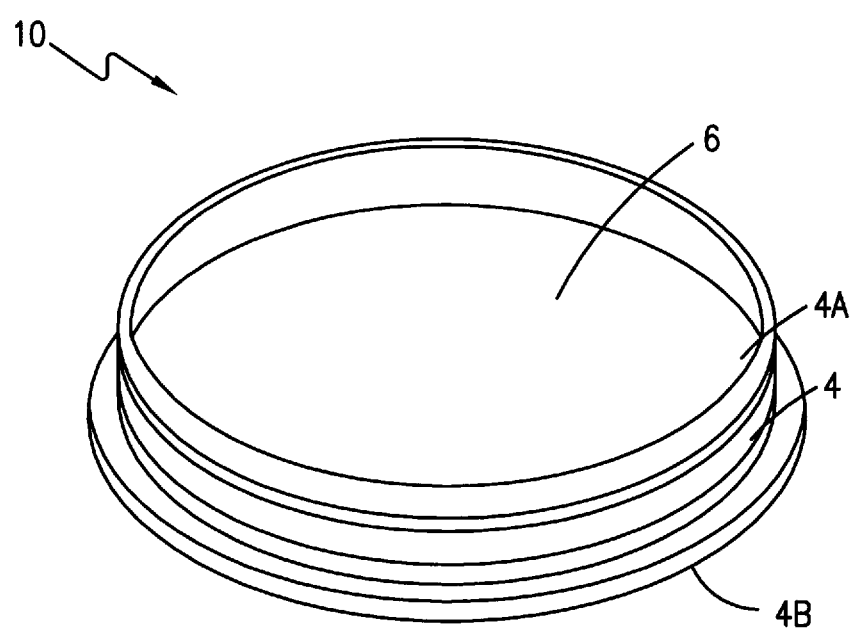
FIG. 1E is another perspective of second conductive surface 4 by itself.
Figure 1F:
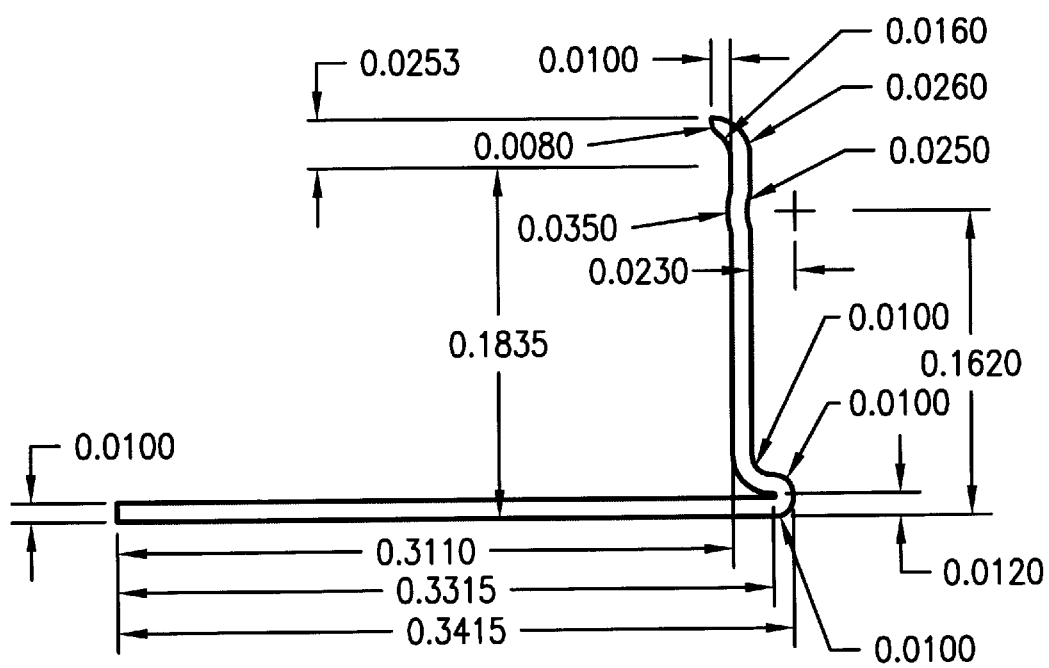
FIG. 1F is a cross-sectional view showing the relative dimensions of the second conductive surface 4 of electronic module 10 shown in FIGS. 1A–1B.
Figure 1G:
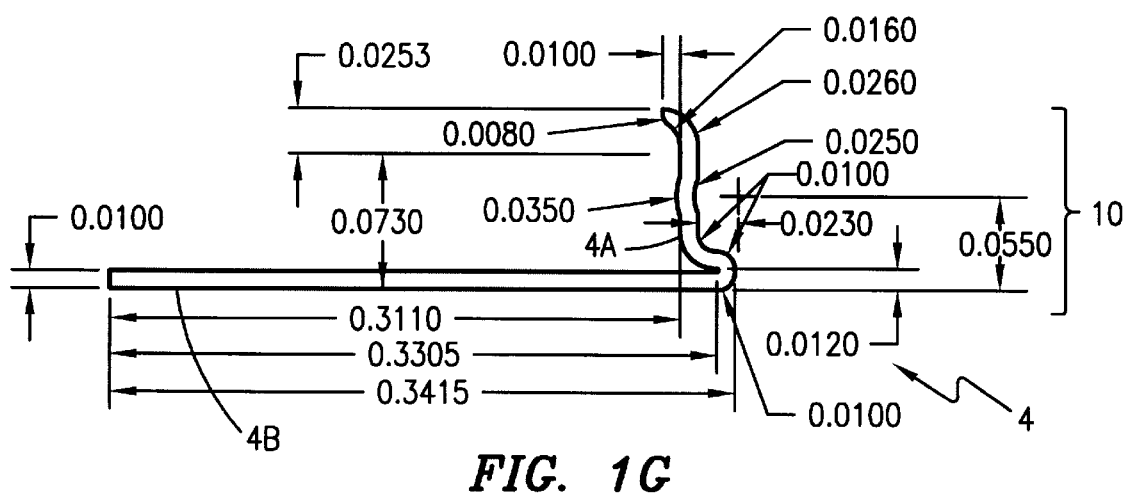
FIG. 1G is a cross-sectional view of the relative dimensions of the second conductive surface 4 of electronic module 10 shown in FIGS. 1C–1E.

Referring to FIGS. 1B–1G, FIG. 1B is an isometric view of the first and second surfaces 2 and 4 of the electronic module 10 when they are assembled together or crimped together to form the coin or button-shaped electronic token, known as electronic module 10. FIG. 1D is another illustration of the first and second conductive surfaces 2 and 4 interlocked or assembled to form the coin-shaped or button-shaped electronic module 10 having different dimensions than that coin- or button-shaped electronic module 10 shown in FIGS. 1A—1B. FIG. 1E is another perspective of the second conductive surface 4 by itself. FIG. 1F is a cross-sectional view showing the relative dimensions of the second conductive surface 4 of the electronic module 10 shown in FIGS. 1A–1B. FIG. 1G is a cross-sectional view of the relative dimensions of the second conductive surface 4 of the electronic module 10 shown in FIGS. 1C–1E.

Regarding the innovative electronic module 10 shown in FIGS. 1A–1G, preferred embodiments of the electronic module 10 are very compact. Systems access the electronic modules to conduct read/write operations by contacting two of the conductive surfaces themselves. All of the second conductive surfaces 4 shown in FIGS. 1A–1G have a groove or indentation 8B that is continuous around the perimeter of a raised perimeter 4A of second conductive surface 4, which is preferably circular in shape. Groove 8B provides a convenient mechanical structure for electronic probe 20 or other device (e.g., module clip 100, module connectors 44 and 46, which are discussed below) to electrically couple or "lock" on to in order to stabilize the electrical contact between electronic module 10 and electronic probe 20. The dimensions of groove 8B positioned on/in second conductive surface 4 (e.g., the width, the depth, the length) as well as the dimensions of the first conductive surface 2 and the second conductive surface 4 of the electronic module 10 (e.g., the height, the width, the diameter, the length) can be naturally altered depending upon the size limitations and requirements of the embedded circuitry therein and the particular applications involved. Please note that while groove 8B in preferred embodiments is continuous, it may be intermittent, and that other shapes of portion 2A are possible as well (e.g., square, rectangular, octagonal, etc.). In short, groove 8B allows electronic module 10 to lock or snap into electronic module connectors 44 and 46, which will be discussed below.

Figure 1H:
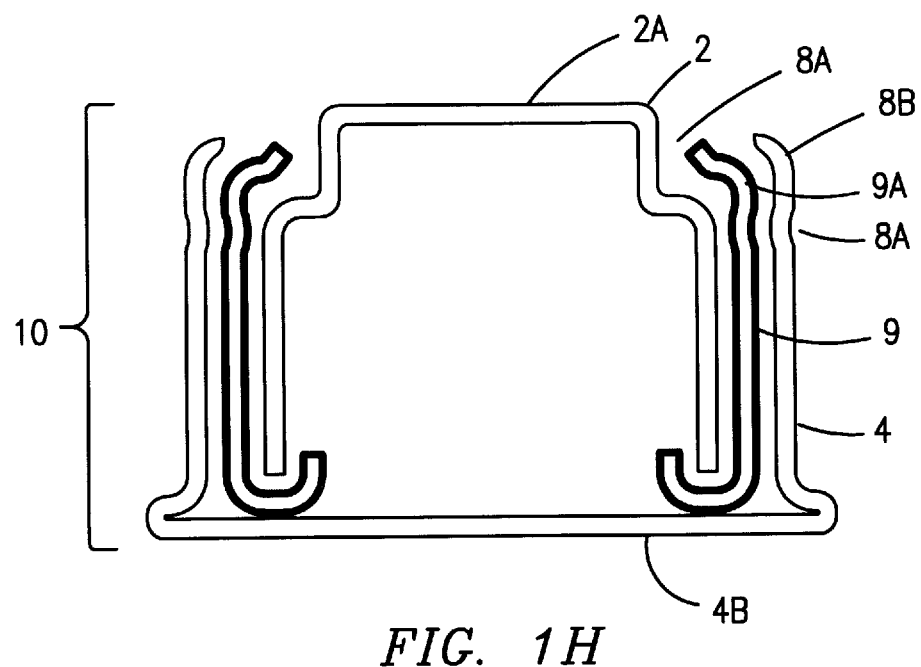
FIG. 1H is a cross-sectional view of the first and second conductive surfaces 2 and 4 of the electronic module 10 that highlights the utility of groove 8A and the actual location of insulator 9.

FIG. 1H is a cross-sectional view of the first and second conductive surfaces 2 and 4 of the electronic module 10 that highlights the utility of groove 8A and the actual location of insulator 9. Groove 8A helps provide a stepped mechanical interference and a good seal between first and second conductive surfaces 2 and 4. Electronic modules 10 are preferably crimped together, so that the combination of forces of second conductive surface 4 against insulator 9 secure first conductive surface 2 in place, so that it cannot be easily removed. One end 9A of insulator 9 will bend over or into groove 8A and preferably extend beyond curved or curled end 4B of conductive surface 4. As mentioned above, insulator 9 is essentially a sleeve that surrounds portions of first conductive surface 2 that may come in contact with second conductive surface 4, namely, portions of first conductive surface 2 positioned or located inside second conductive surface 4. Insulator 9 may be an intermittent sleeve, so long as first and second conductive surfaces 2 and 4 are electrically isolated from one another.

Figure 2A:
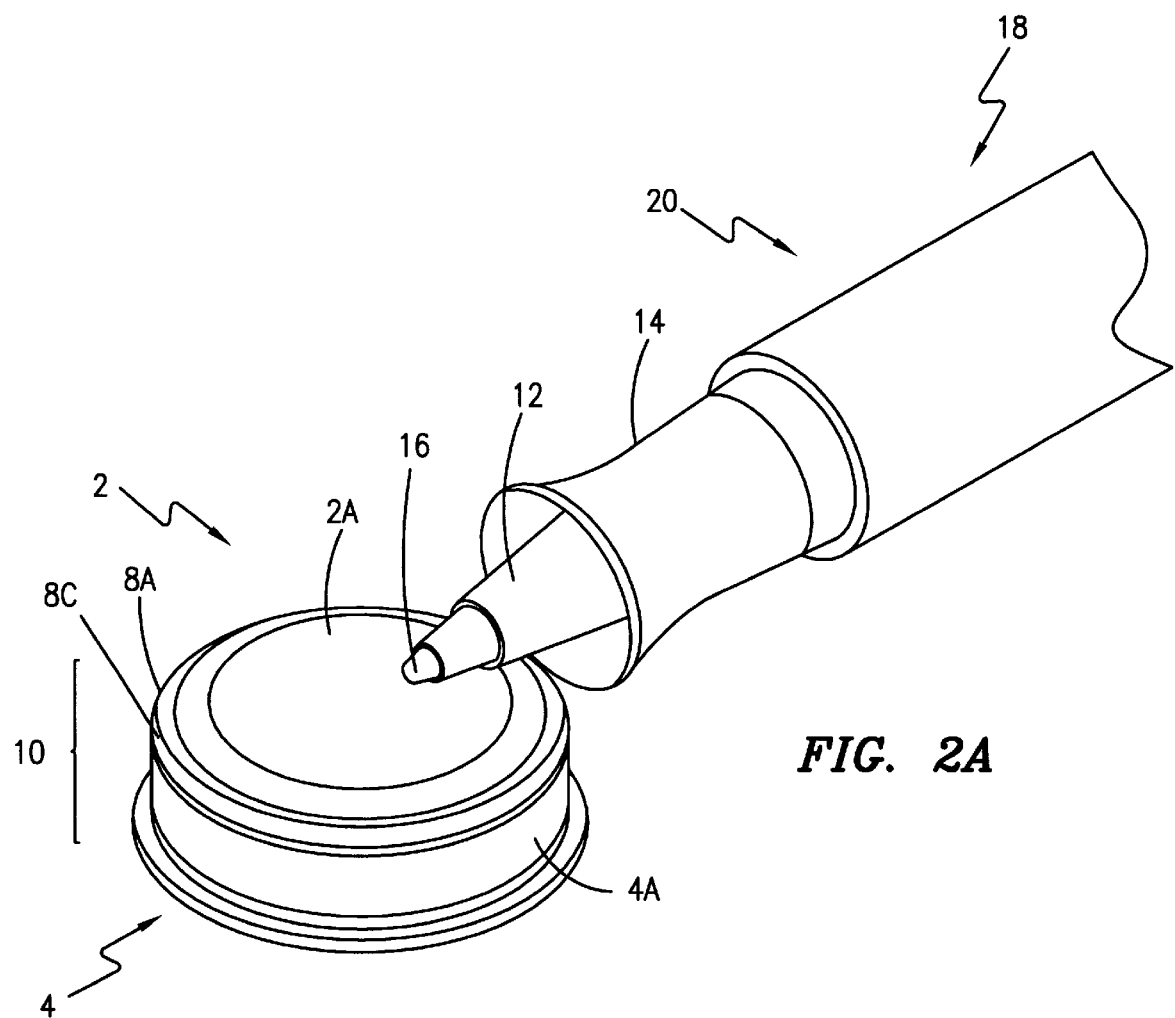
FIG. 2A is a view of electronic probe 20 accessing or contacting electronic module 10.
Figure 2B:
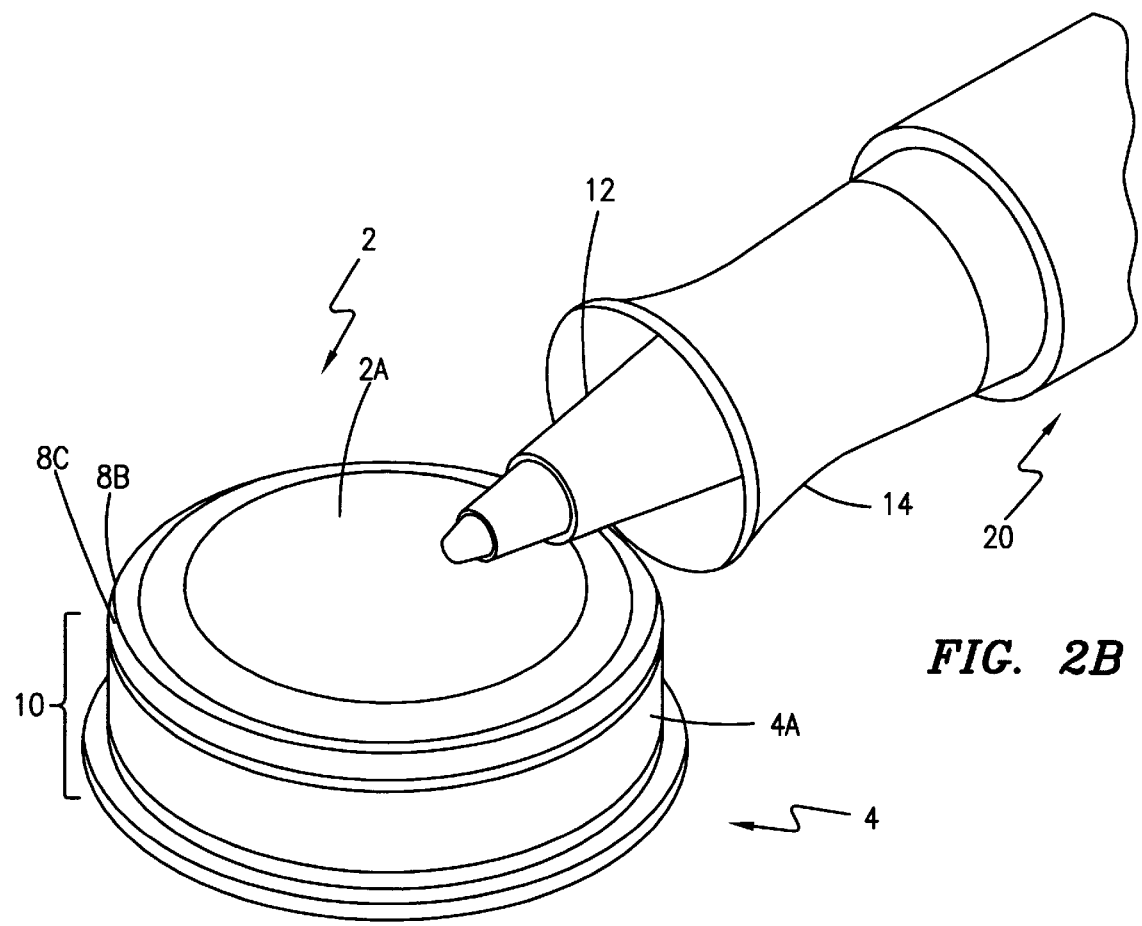
FIG. 2B is a close-up view of the electronic probe 20 contacting electronic module 10.
Figure 2C:
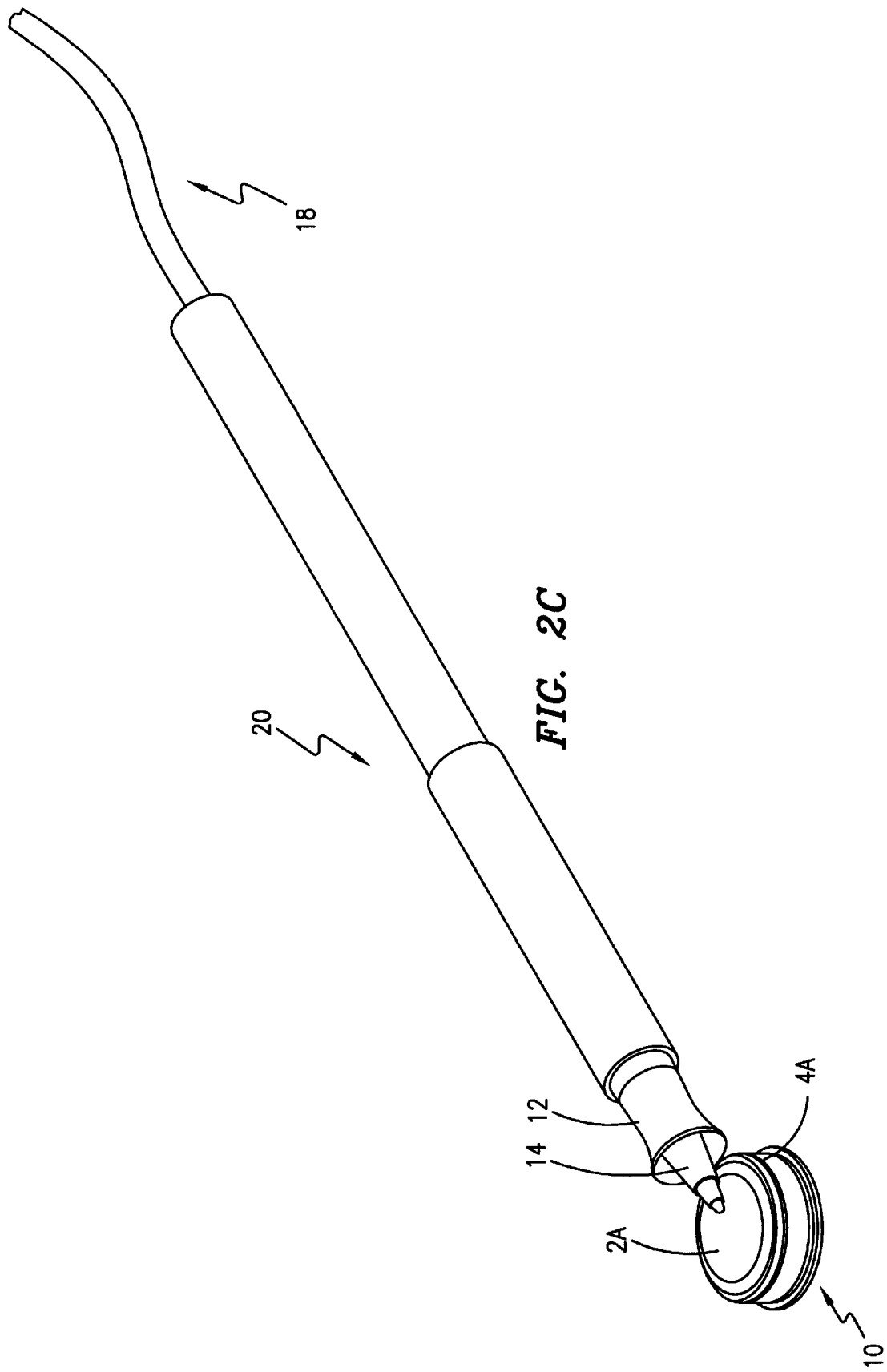
FIG. 2C is another view from a further distance of electronic probe 20 contacting the improved Touch Memory™ module 10 showing an electrical probe cable 18 electrically coupled to electronic probe 20.
Figure 2D:
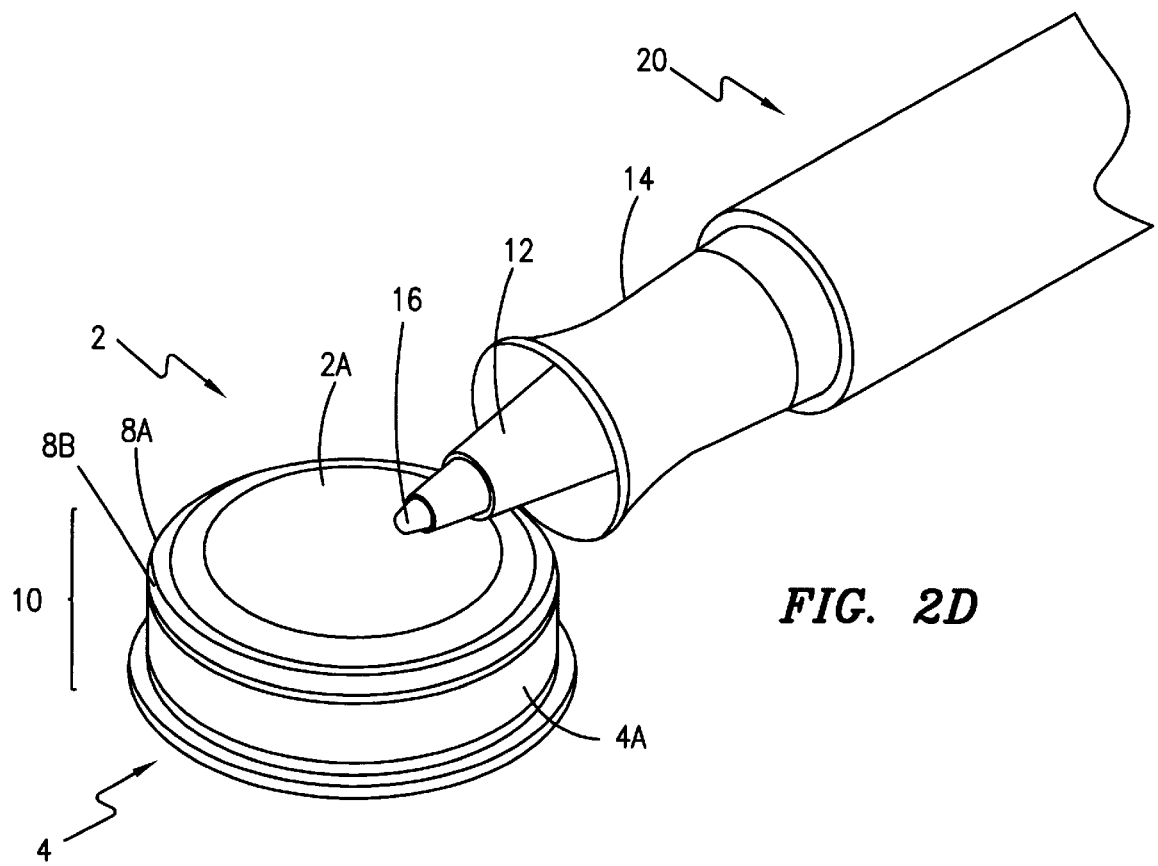
FIG. 2D is yet another close-up view of the electronic probe 20 contacting electronic module 10.

FIGS. 2A–2D show the interaction of electronic module 10, shown in detail in FIGS. 1A–1G, and electronic probe 20 interacting. More specifically, referring to FIGS. 2A–2D, FIG. 2A is a view of electronic probe 20 accessing or contacting electronic module 10. Similarly, FIG. 2B is a close up of the electronic probe 20 contacting electronic module 10. Likewise, FIG. 2C is another view from a further distance of electronic probe 20 contacting the improved Touch Memory™ module 10 showing an electrical probe cable 18 electrically coupled to electronic probe 20. Likewise, FIG. 2D is yet another close up of the electronic probe 20 contacting electronic module 10.

Electronic probes 20 shown in FIGS. 2A–2D are used to read and write the electrical components (e.g., memory) embedded in the circuitry preferably positioned inside cavity 6 created by the first and second conductive surfaces 2 and 4 of the electronic coin-shaped, button-shaped token or module 10. Electronic probe 20 is pencil-shaped or generally cylindrical shaped to enable one to easily hold it and use probe 20 as a writing utensil. Electronic probe 20 preferably comprises a patterned, rubberized, gripping apparatus to allow someone to easily hold electronic probe 20. In addition, electronic probe 20 is comprised of at least contact 12 and contact 14, which are electrically isolated from one another, just like first conductive surface 2 and second conductive surface 4 of electronic module 10. First conductive contact 12 extends in a pointed fashion in order to provide a pencil-like, sharpened tip that can contact with first conductive surface 2 of electronic module 10. Electronic probe 20 has the added advantage that tip 16 can also be used with note book style personal computers, etc. Second contact 14 is preferably a sleeve that fits or is positioned continuously around the perimeter of the overall probe and provides a collar or sleeve structure to contact second conductive surface 4 of the electronic module 10. Electronic probe 20 is connected to a host system (e.g., a personal computer, a portable Touch Memory™ reading device) via an electrical probe cable 18 (see FIG. 2C).

Figure 3A:
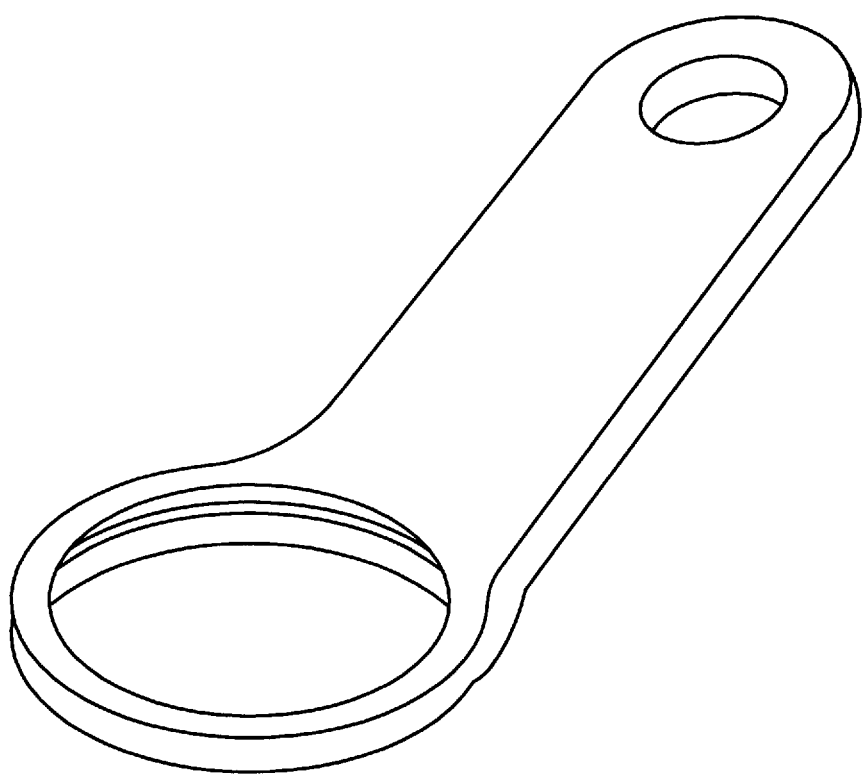
FIGS. 3A, 3B and 3C are close-up views of the improved FOB design to house or hold electronic module 10.
Figure 3B:
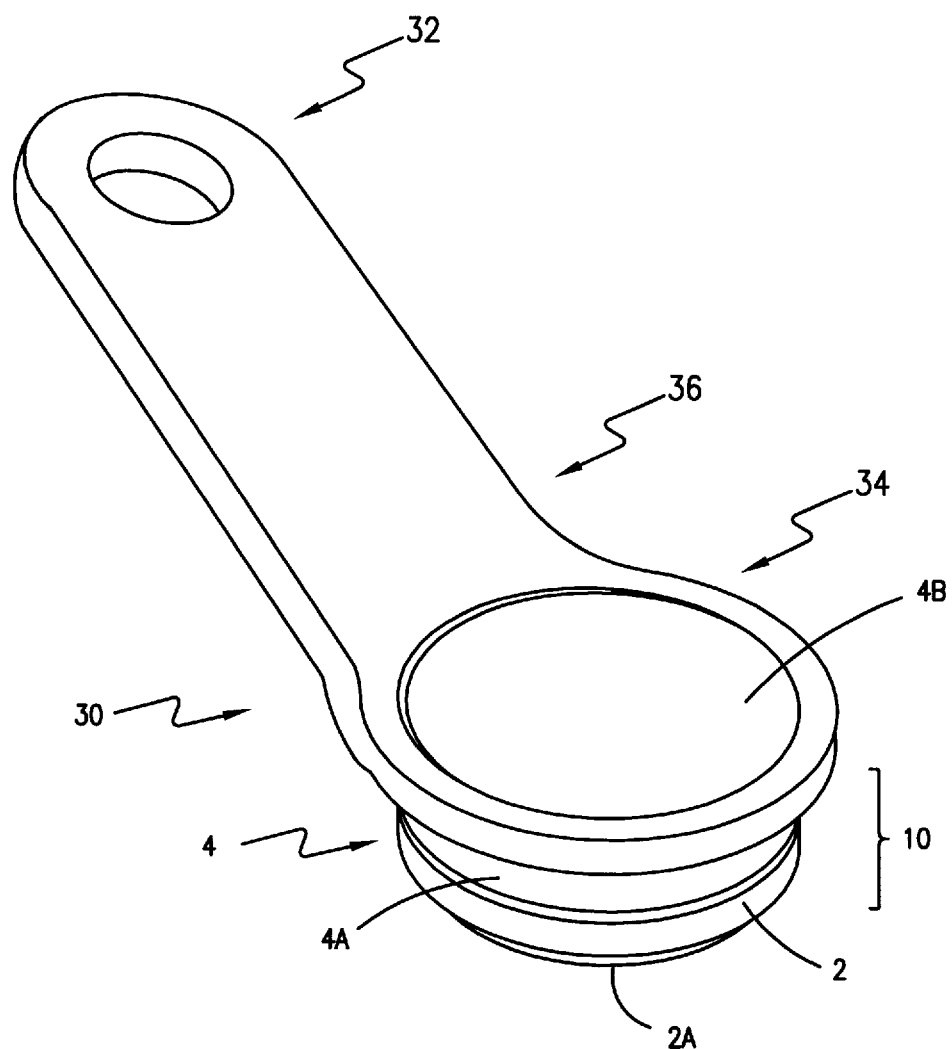
Figure 3C:
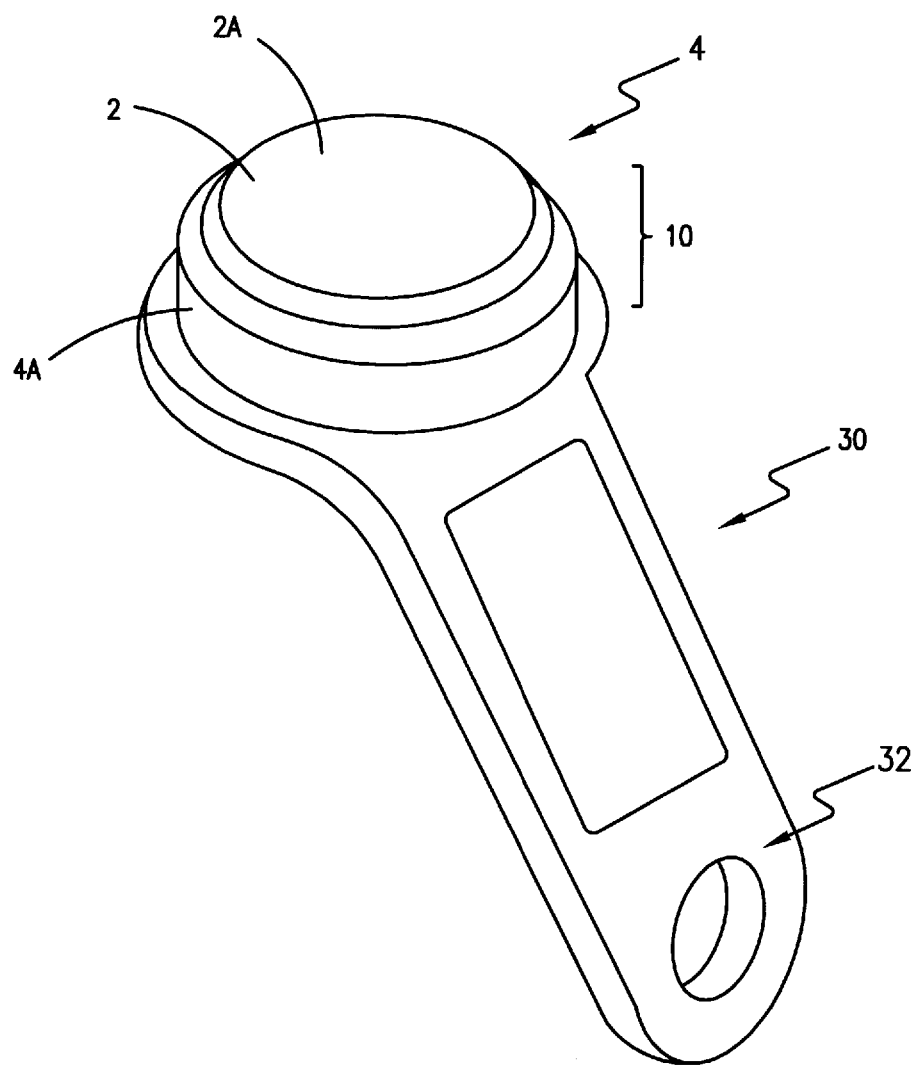

Referring to FIGS. 3A–3C, FIG. 3A is a close-up view of the improved FOB design to house or hold electronic module 10. FIGS. 3B and 3C are close-up views of module 10 housed in FOB 30. FOB 30 is ergonomically designed. In particular, it comprises a curved shape 36 to provide a cupped or scooped surface for a human finger (e.g., a thumb) to position itself and press against the planar surface 34 (which is actually part of electronic module 10, e.g., planar surface 4B of second conductive surface 4) so that electronic module 10 is pressed against another receptacle (not shown) in order to provide a good electrical coupling or contact between the two. More specifically, FOB 30 is preferably bent at approximately a 35 degree angle to allow a user to position his four fingers around it and press his thumb against the backside of the electronic module 10, which enables the user to easily guide electronic module 10 into a reader probe, a receptacle, or holder, as discussed below. FOB 30 may be comprised of a non-conductive materials (e.g., plastic, etc.) or conductive materials (e.g., steel, aluminum, metals, etc.). In addition, FOB 30 has hole 32, which enables a chain or string to be slipped through hole 32, so that FOB 30 can be mounted on a key ring, etc.

Figure 4A:
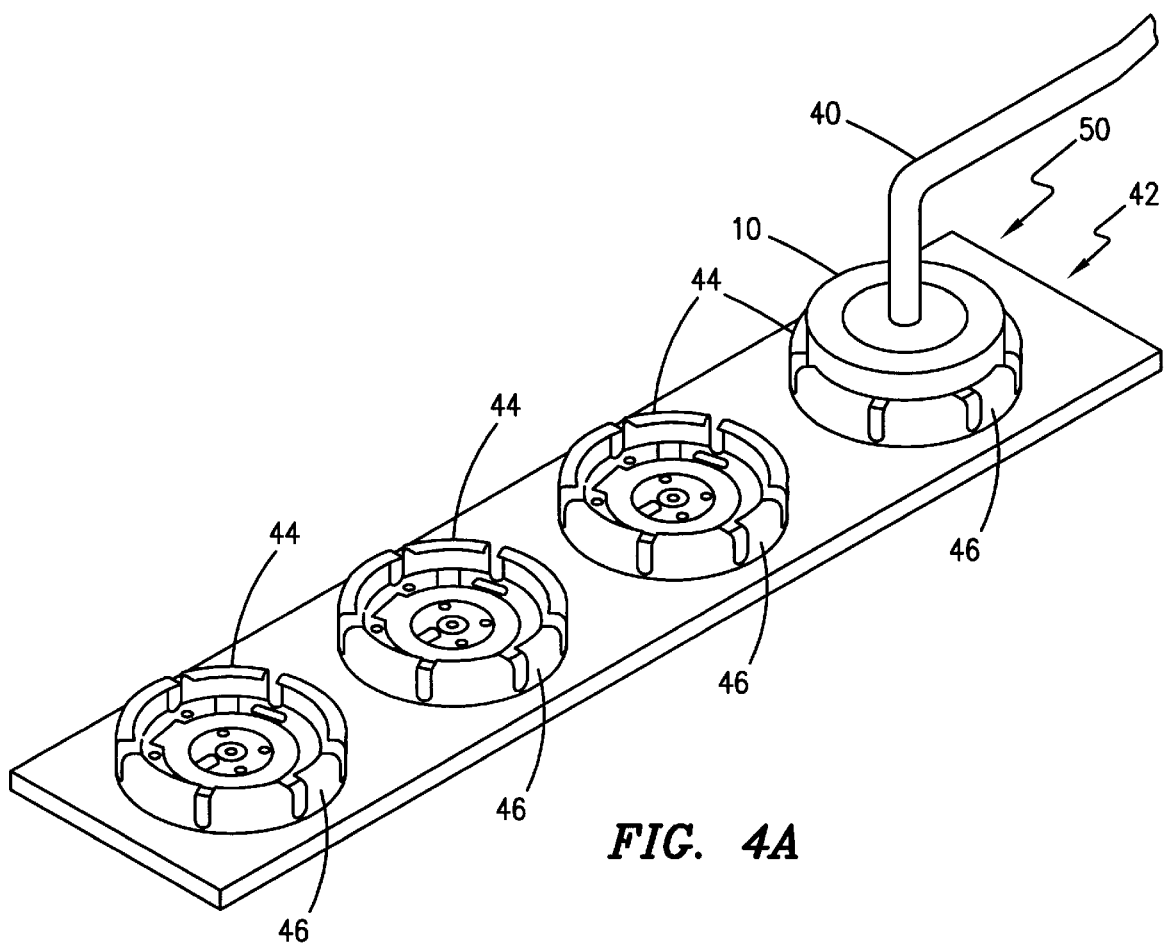
FIG. 4A is a diagram of electronic module connectors 44 and 46, which includes a separate portion 42 (e.g. circuit board)
Figure 4B:
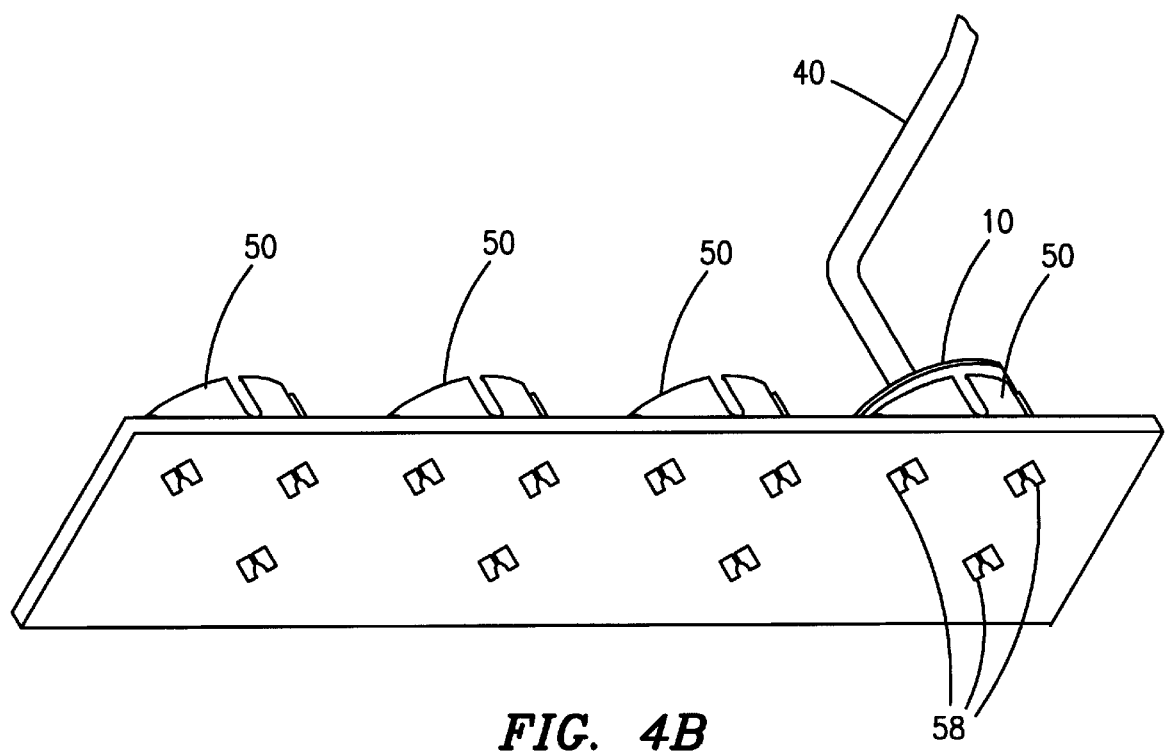
FIG. 4B is a view showing the underside of board 42 to which electronic module connectors 44 and 46 are positioned along with electronic module 10 with cable in one of the Touch Memory™ connectors.
Figure 4C:
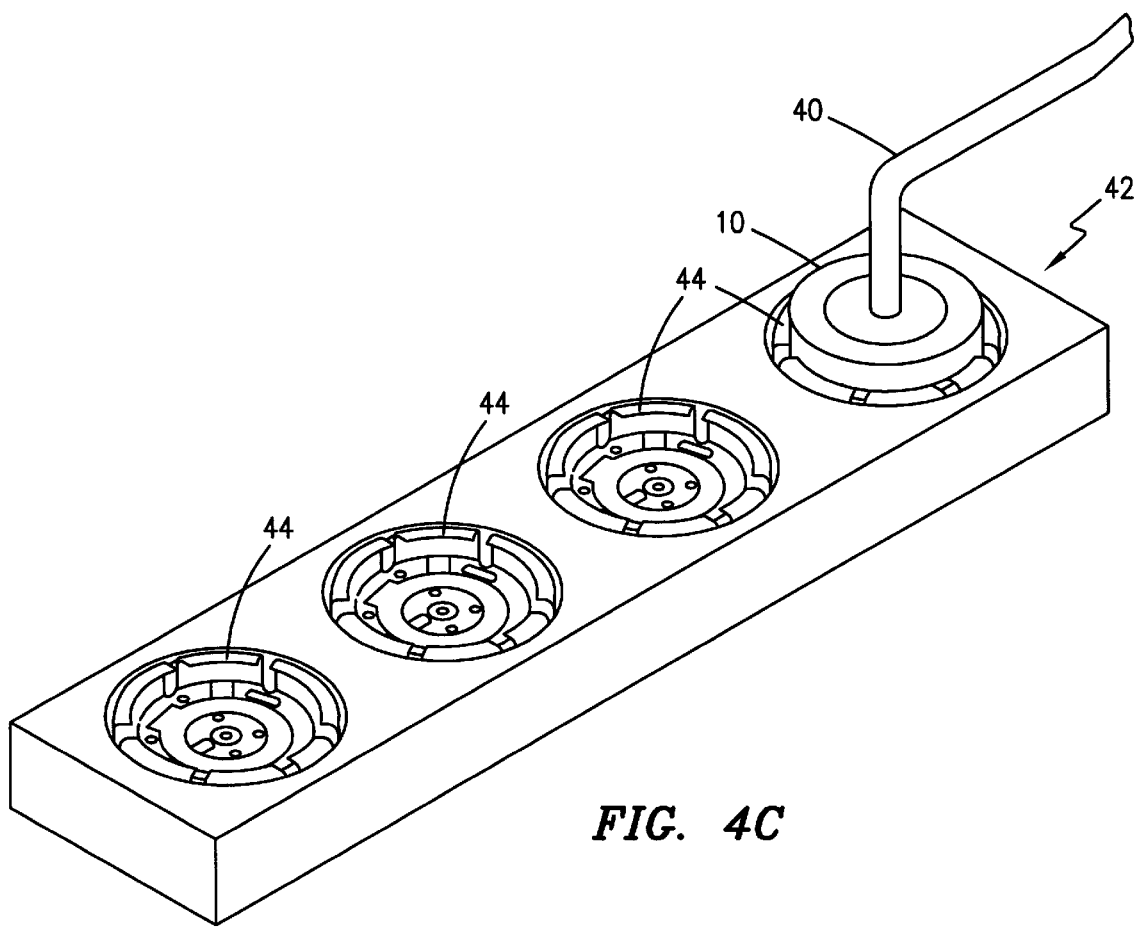
FIG. 4C shows the structure shown in FIGS. 4A and 4B along with a surrounding cover 48 which protects electronic module connectors 44 from being accidentally bent or contacted as well as providing support.
Figure 4D:
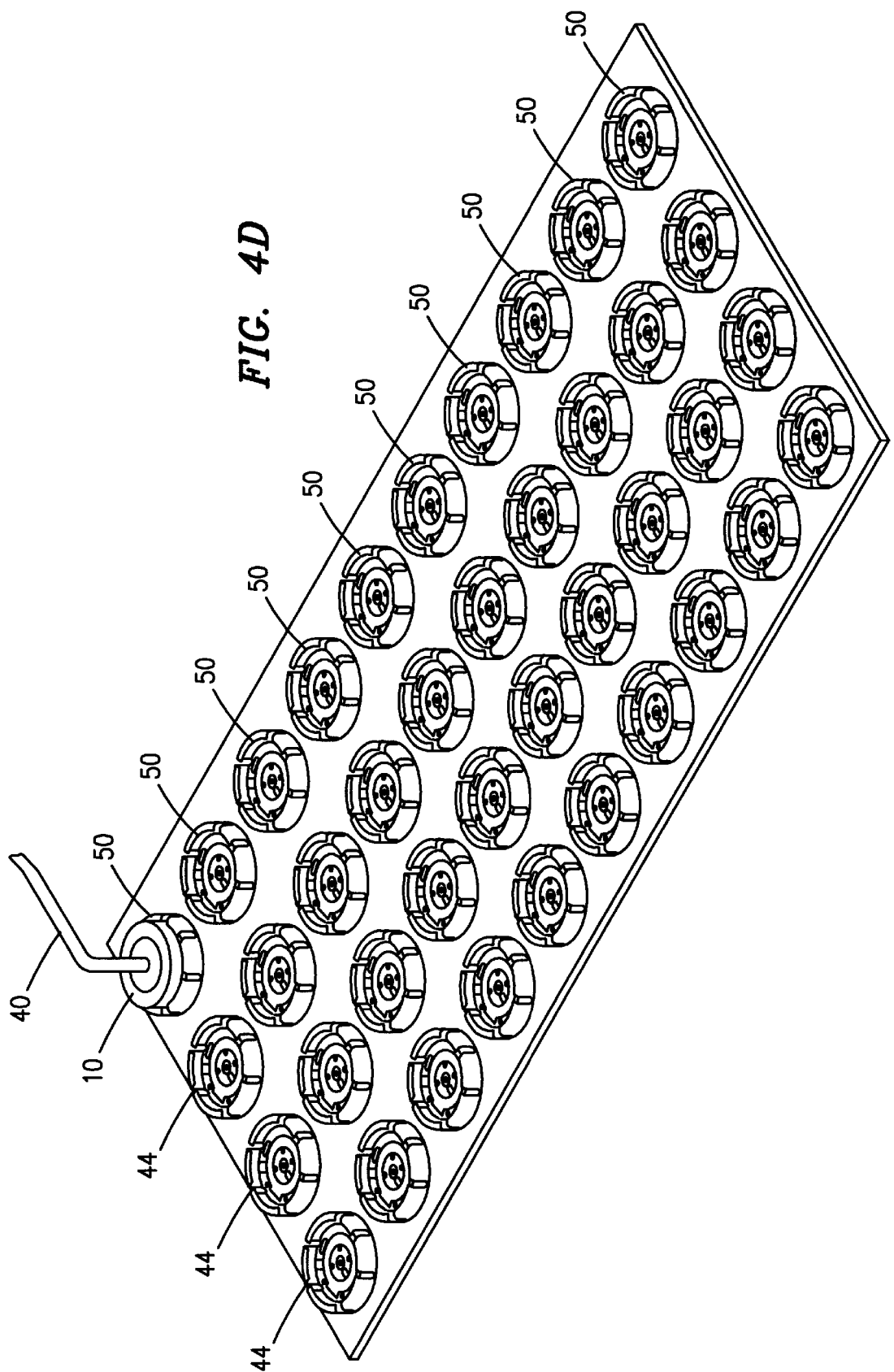
FIG. 4D shows an array of electronic module connectors 44 and 46 connected or coupled to board 42.

Referring to FIGS. 4A–4D, FIG. 4A is a diagram of electronic module connectors 44 and 46, which includes a separate portion 42 (e.g. circuit board). Electronic module connectors 44 and 46 are preferably affixed to a planar surface (e.g., printed circuit board) in a plurality or grouping (of four) 50. Electronic module 10 is positioned in one electronic module connector 44 and is electrically coupled to electrical module cable 40. FIG. 4B is a view showing the underside of board 42 to which electronic module connectors 44 and 46 are positioned along with electronic module 10 with cable in one of the Touch Memory™ connectors. FIG. 4C shows the structure shown in FIGS. 4A and 4B along with a surrounding cover 48 which protects electronic module connector 44 from being accidentally bent or contacted as well as providing support. FIG. 4D shows an array of electronic module connectors 44 and 46 connected or coupled to board 42.

More specifically, electronic module connectors 44 and 46 provide means for an electronic module(s) 10 to be secured and held to electronic module connectors 44 and 46, which is discussed in more detail below. In some applications, as shown, the electronic module 10 may be electrically coupled to a wire or other connector styled electronic module cable 40, which also may be angled to easily allow someone to hold it in their hand and put their thumb on the top end of the electronic module cable 40 (which may be rigid) and/or against electronic module 10 itself. Electronic module connectors 44 and 46 secure electronic module 10 to a fixed or stable location (e.g., on board 42). Once again, electronic module connectors 44 and 46 are preferably grouped in groups of four, but may be manufactured, sold, or made available individually or in an array of four by x any size (e.g., 10, as shown in FIG. 4D). An advantage of the overall grouping shown in FIG. 4D is that the actual size is variable—in that a column of four electronic modules 50 can be broken off or separated from the rest of the electronic modules 52 shown. Referring to FIG. 4B, electronic module connectors 44 and/or 46 extend through the board 42, which allows for them to be connected or electrically coupled to wires underneath board 42. In fact, the portion of electronic module connector 44 and/or 46 that extends through board 42 is actually split or equipped with a slot to cut through insulation commonly found on electrical wires and contact the wire itself and to hold a electrical wire firmly in place. Electronic module connector 44 and 46 can be soldered to board 42.

Referring to FIGS. 5A–5D, electronic module connectors 44 and/or 46 are comprised of a conductive material (e.g., steel) and are multi-functional. Like electronic module 10, electronic module connectors 44 and 46, that preferably operate in tandem with one another, are shaped in a fashion that is able to receive and secure electronic module 10 to ensure a solid electrical contact to the first and second conductive surfaces 2 and 4 of electronic module 10. Electronic module 10 may be viewed as a male piece and electronic module connector 44 and 46 are viewed as a female piece.

Figure 5A:
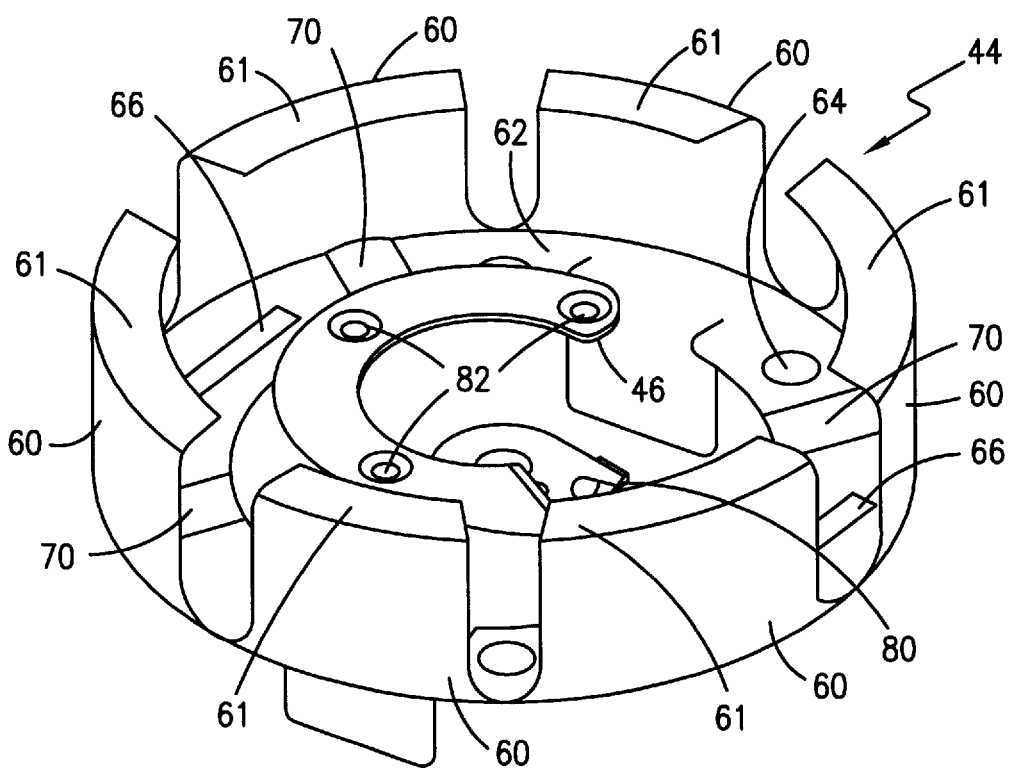
FIGS. 5A–5D are isometric views of electronic module connectors 44 and 46.
Figure 5B:
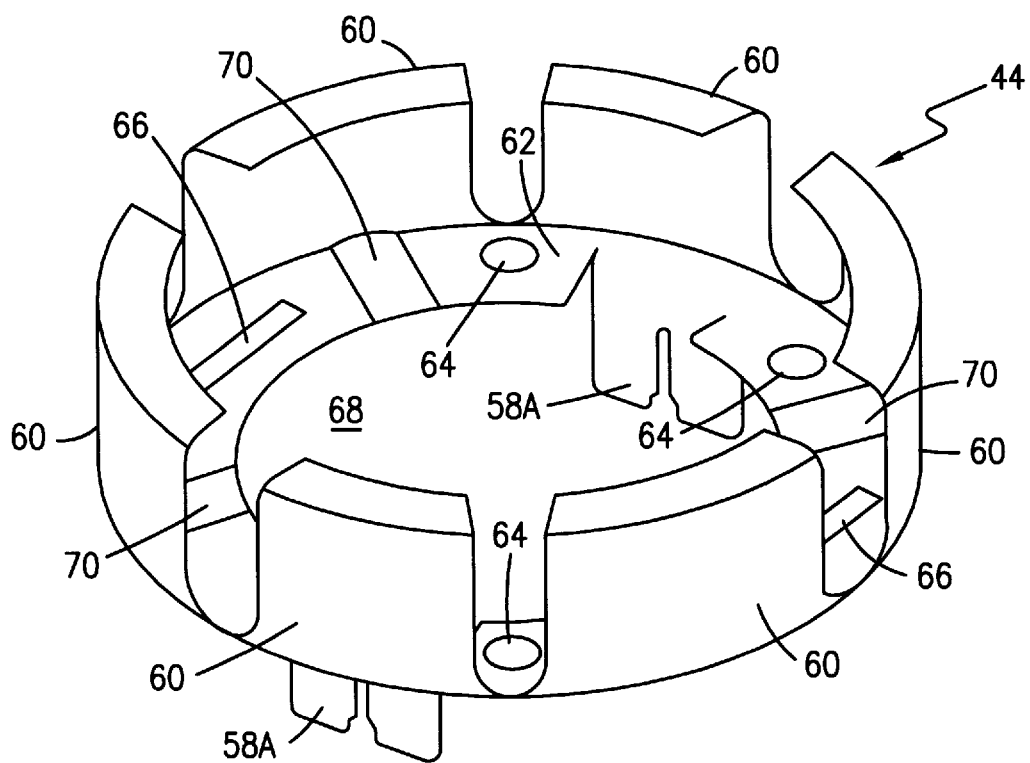
Figure 5C:
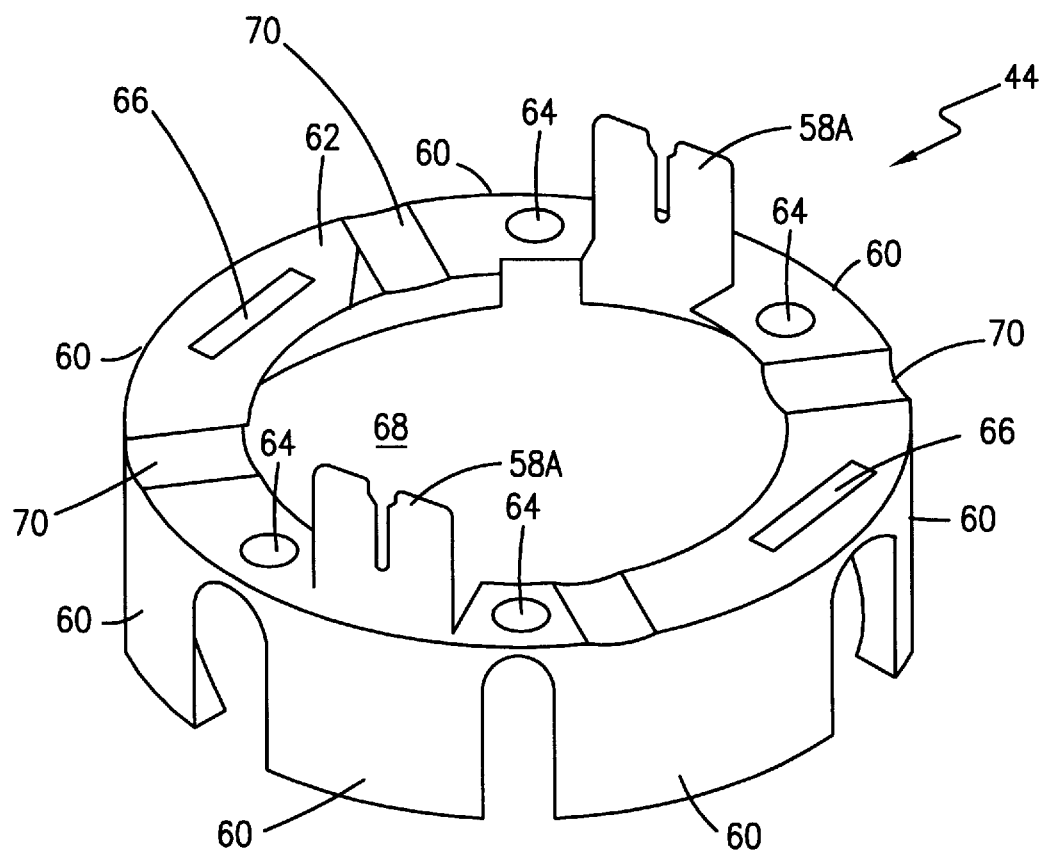

Referring to FIGS. 5A–5C, regarding electronic module connectors 44 and 46, raised surfaces 60 are positioned periodically around the perimeter of electronic module connectors 44. Electronic module connectors 44 are shaped to receive electronic module 10. For instance, if electronic module 10 is a button-shaped or coin-shaped token, as is preferred (but other shapes are possible, i.e., cubical, rectangular, octangular, etc.), module connectors will be circular and roughly have the same diameter and perimeter dimensions. Raised surface(s) 60 comprise only portion(s) of electronic module connector 44. Electronic module connector 44 also extends horizontally or at an angle (e.g., perpendicular, at a right angle—90 degrees) to raised surface (s) 60. This flat or horizontal portion 62 is positioned underneath electronic module 10 (not shown) when it is inserted inside electronic module connector 44. Horizontal portion 62 is also positioned between electronic module connector 44 and board 42 (see FIGS. 4A–4D). In fact, all of the portions are electrically connected to each other and preferably comprised of the same material and are preferably made from the same tool. Raised surfaces 60 are raised to approximately same height as the height or depth of electronic module 10 and are positioned intermittently around the perimeter of electronic module connector 44. Raised surfaces 60 are preferably formed at the top (formed portion 61) preferably at approximately 30 degrees in order to lock, secure, or clamp electronic module 10. Formed portion 61 rests inside indentation 8B found in electronic module 10. It is possible, but not as desirable, that curved portion 61 also extends over electronic module 10. While raised surfaces 60 are flexible to bend or flex away from the geometric center of electronic module connector 44 to allow electronic module 10 to be inserted into the concave opening of electronic module connector 44, the overall material and nature of raised surface 60 of electronic module connector 44 is that it is stiff enough to etch or cut through the native oxide layer that exists on virtually all metallic, conductive surfaces that are exposed to the environment, such as first and second conductive surfaces 2 and 4 of electronic module 10. In addition, at least one hole 64 is positioned periodically in the horizontal portion 62 to allow rivets, screws, or other fastening mechanisms to attach electronic module connector 44 to board 42 or any other needed surface or object to which one wants electronic module 10 to be affixed (e.g., inventory items, clothing, badges, etc.). Similarly, note groove(s) 66 is also present to permit a raised dimple on board 42 to be inserted through to provide an additional stabilizing influence (e.g., prevents electronic module connector 44) from being rotated or moved. Raised curved surface(s) 70, which are also positioned on horizontal portion 62 of electronic module connector 44, create a passageway—especially when electronic module connector 44 is appropriately positioned on planar surface 34 which enables conductive, preferably insulated, wires or other electrical contacts to be inserted under or through electronic module connector 44 in order to couple with electronic module connector 46, which is preferably positioned in opening 68 of electronic module connector 44. These passageways have the added advantage of allowing electrical wire to be routed or channeled without having to go into board 42 or surface on which it is resting. Opening 68 exists in the center of electronic module connector 44—that creates an area in which electronic module connector 46 can be positioned. Groove 66 also allows back-to-back mounting of 44 and 46, so that when mounted back-to-back on circuit board 42 tabs 58A will be inserted through circuit board 42 and through grooves 66.

Figure 5D:
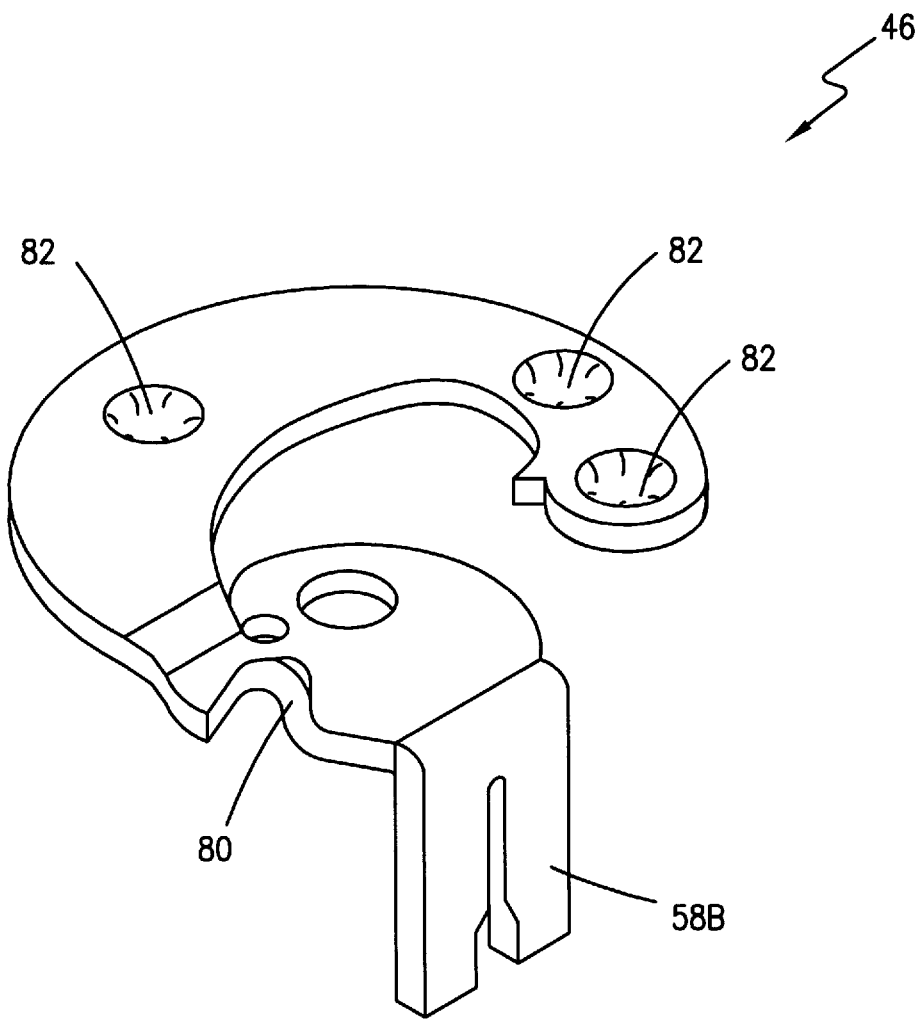

Referring to FIGS. 5A and 5D, electronic module connector 46 is a spring-like mechanism that when pressed exerts a force in the opposite direction. As a result, when an electronic module 10 is positioned inside electronic module connector 44, electronic module connector 46 exerts a force against the first conductive surface 2 of electronic module 10. Similarly, formed portion 61 of raised surface 60 exerts a force against the second conductive surface 4 of electronic module 10—and electronic module connectors 44 and 46 are separate and electrically isolated from one another as are first conductive surface 2 and second conductive surface 4 electrically insulated from one another. This is important because electronic module connectors 44 and 46 serve as connectors or "extended terminals" to enable additional electrical wires to be connected therein. As mentioned above, electronic module connector 46 is curvilinear and designed with sufficient thickness to provide a desired "stiffness" to exert a desired force (greater than 200 grams) against first surface of electronic module 10. Electronic module connector 46 also has a bump or curved edge, raised continuous surface 80, positioned on the outer edge of center portion of electronic module connector 46 positioned on board 42 (not shown) at one end. Curved, raised continuous surface 80 also provides a housing for a wire or other electrical coupling mechanism to be positioned. At least one dimple 82 is positioned periodically on the curvilinear surface of electronic module connector 46 that extends in one direction parallel to electronic module connector 46 in a direction opposite. Preferred embodiments actually have three dimples 82 that are deep enough to prevent first conductive surface 2 of electronic module 10 from contacting raised curved surface(s) 70 of electronic module connector 44 in order to prevent an electrical short.

As discussed above in reference to FIG. 4B (and also shown in FIGS. 5A–5D), tab(s) 58A extend from electronic module connector 44 and tab 58B extends from electronic module connector 46. In fact, tab 58 (58A and 58B) preferably are slotted to provide a mechanism to cut through insulation on electrical wire and contacct the wire itself that may be attached to electronic module connectors 44 and 46.

Figure 6A:
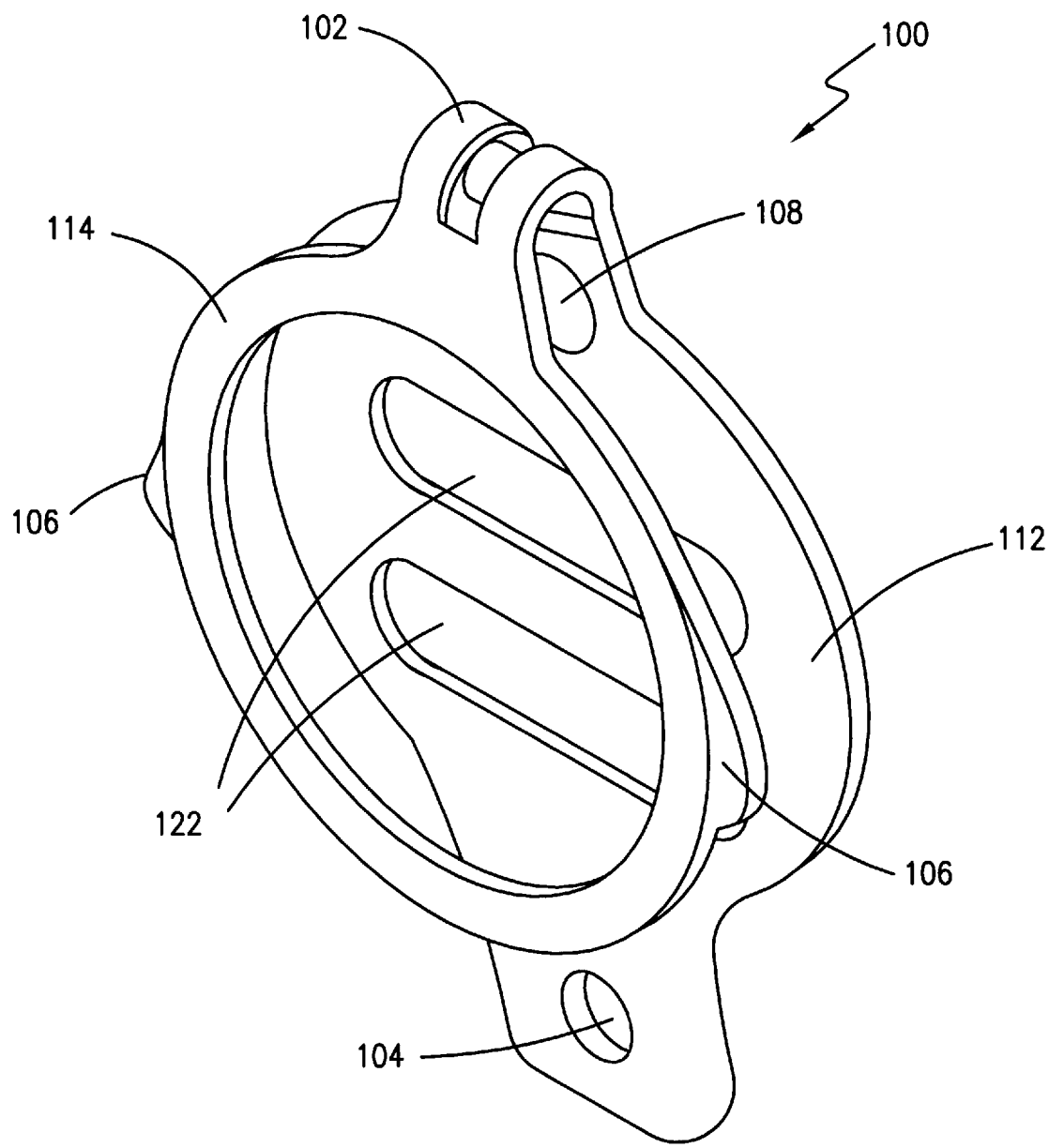
FIGS. 6A–6B is module clip 100 which holds electronic module 10, shown in detail in FIGS. 1A–1G
Figure 6B:
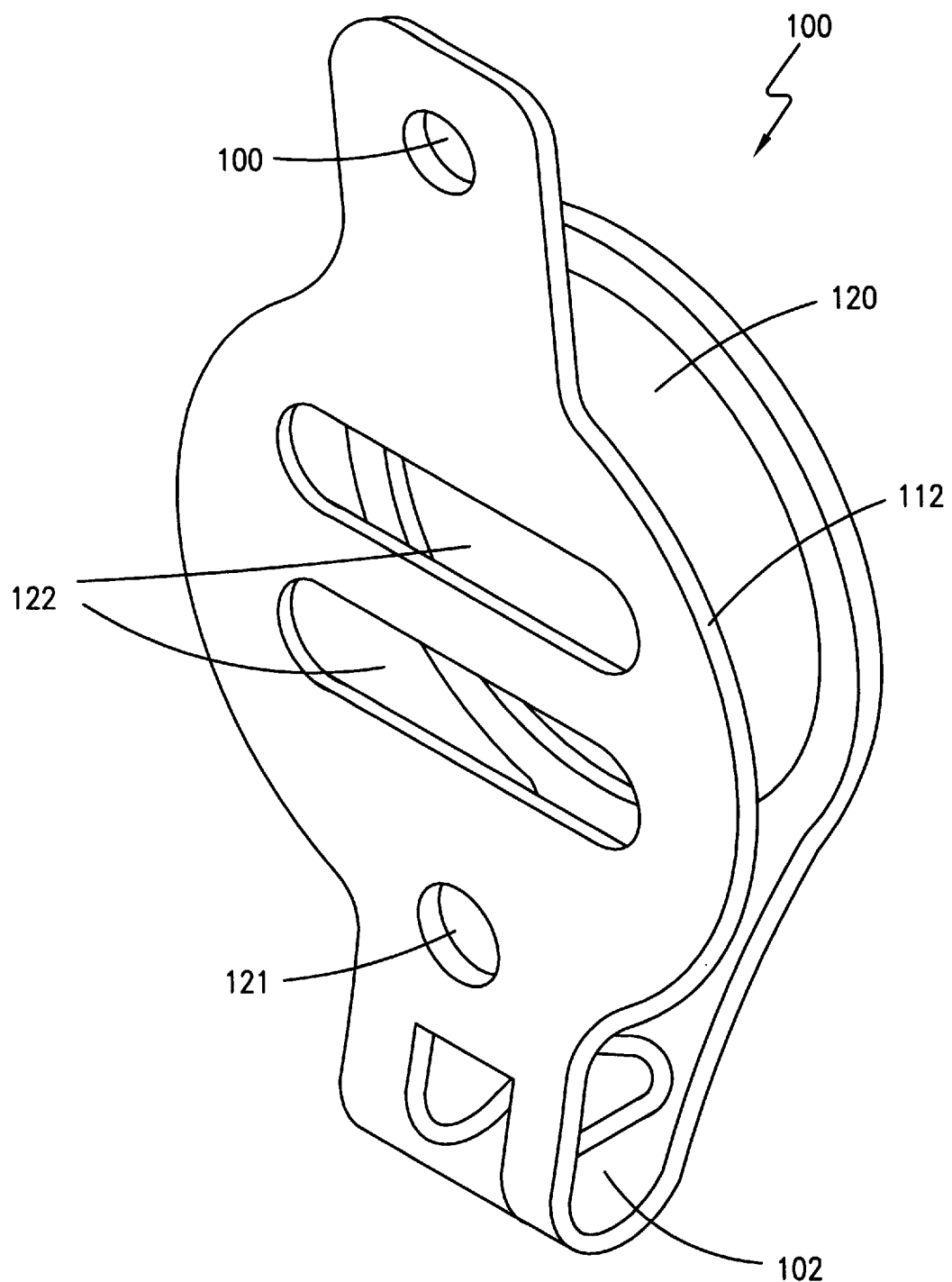
Figure 6C:
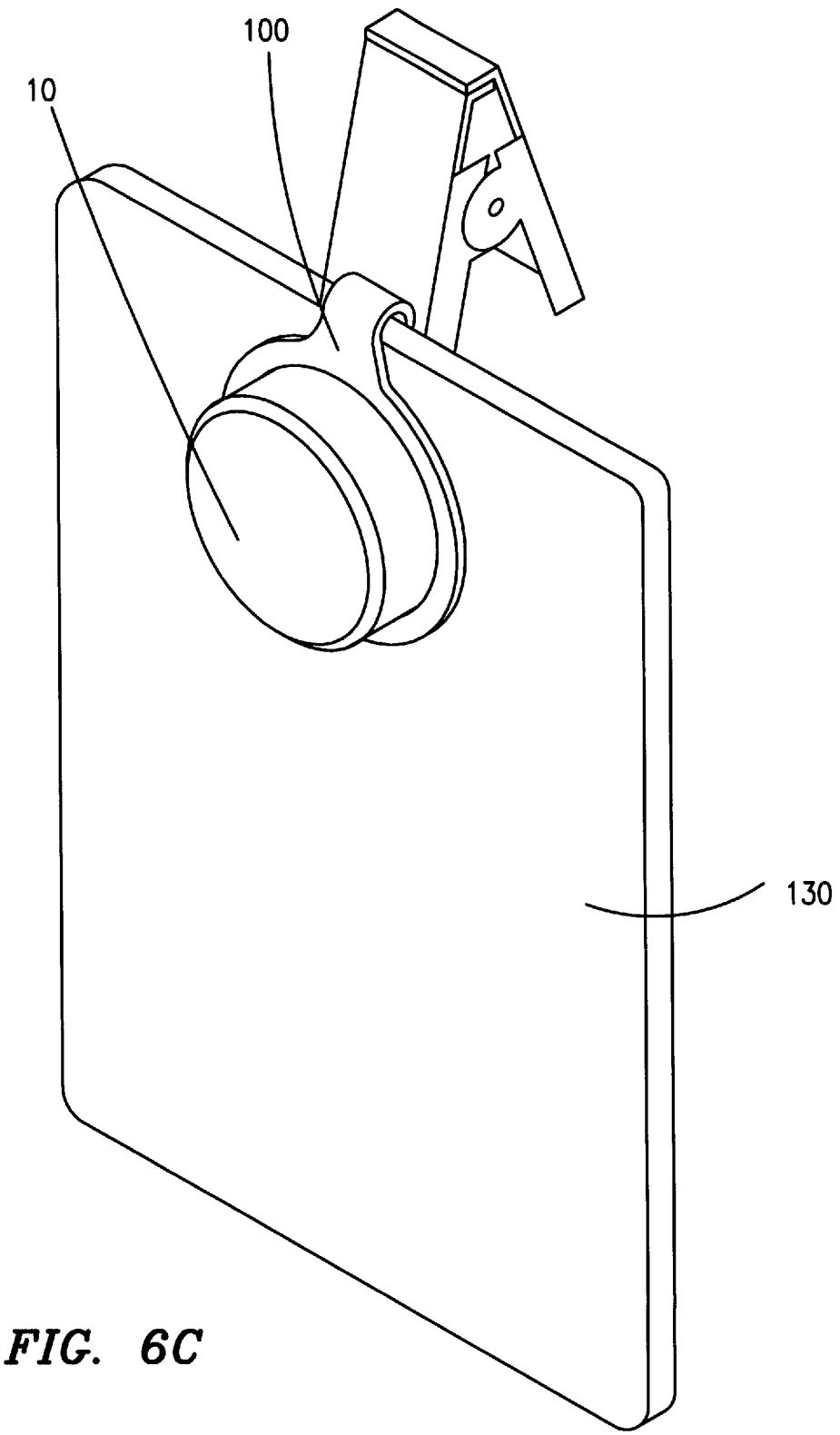
FIG. 6C is an illustration showing the module clip 100 shown in FIGS. 6A and 6B clipped or positioned on a badge or other planer surface (e.g., a badge)

Referring to FIGS. 6A–6C, module clip 100 holds electronic module 10, shown in detail in FIGS. 1A–1G. Electronic module 100 is a single, conductive (e.g., metallic) structure that is bent at approximately a 180 degree angle, in order to fit around a relatively thin planer surface, such as those commonly used as badges, etc. (see badge 130 in FIG. 6C). At the hinge or bending point, there is preferably a double holed angled structure 102 to provide a spring-like action to keep the two ends 112 and 114 of module clip 100 relatively close to one another. In addition, hole 120, which is shaped to match or hold electronic module 10 (e.g., circular) in place between end 112 and end 114 of module clip 100, such that module clip 100 contacts only one surface (e.g., second conductive surface 4 of electronic module 10). In addition, note ears or extended surfaces 106 that provide a surface under which finger nails or the like can be used to open module clip 100, so that electronic module 10 can be easily inserted and removed. In addition, there are at least two slots 122 positioned proximate end 114 of module clip 100 that are preferably thin, horizontally shaped holes that are parallel to one another to allow module clip 100 (holding electronic module 10) to be attached to clothing, etc., or with a safety pin, clip, or the like. More importantly, slots 122 allow a preferably rectangular, planar, item 43 that is preferably comprised of plastic and has snap device to be weaved through the slots, snapped together to secure it in place, and then weaved through another slot in a badge 130, etc. (see FIG. 8). In addition, hole 108 is positioned proximate to end 112 of module clip 100 to enable module clip 100 to be easily attached to a string, chain, necklace, etc. The same is true with respect to hole 104. Preferred embodiments also have a second hole 108 on end 112 that can be used to fasten module clip 100 to clothing, a string, etc.

Figure 6D:
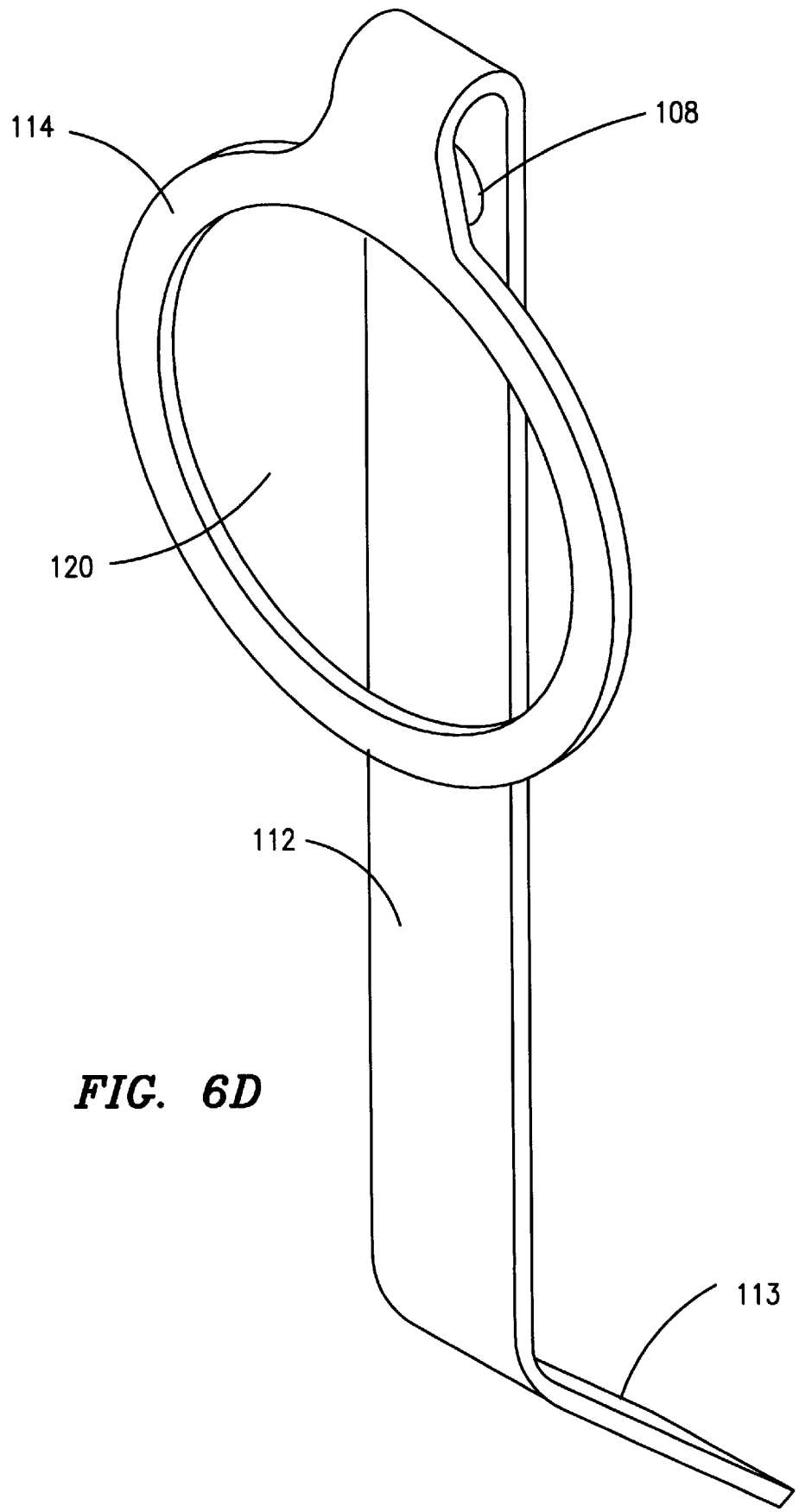
FIG. 6D is an alternate module clip 150 is shown, which is comprised of conductive material (e.g., metal)

Referring to FIG. 6D, an alternate module clip 150 is shown, which is comprised of conductive material (e.g., metal). Like module clip 100, alternate module clip 150 is comprised of a first end 112 and a second end 114 and is folded or bent at approximately a 180 degree angle, so that it can be slipped over a planar surface 34, clothing, etc. Similarly, second hole 108 is positioned near the fold in alternate module clip 150. The tip of second end 114 is preferably bent at a 30 degree angle to provide a surface to hold and/or get a finger or finger nail under it. Electronic module 10 (not shown) is positioned between first end 112 and second end 114, such that module clip 100 contacts only one surface (e.g., second conductive surface 4 of electronic module 10).

Figure 7A:
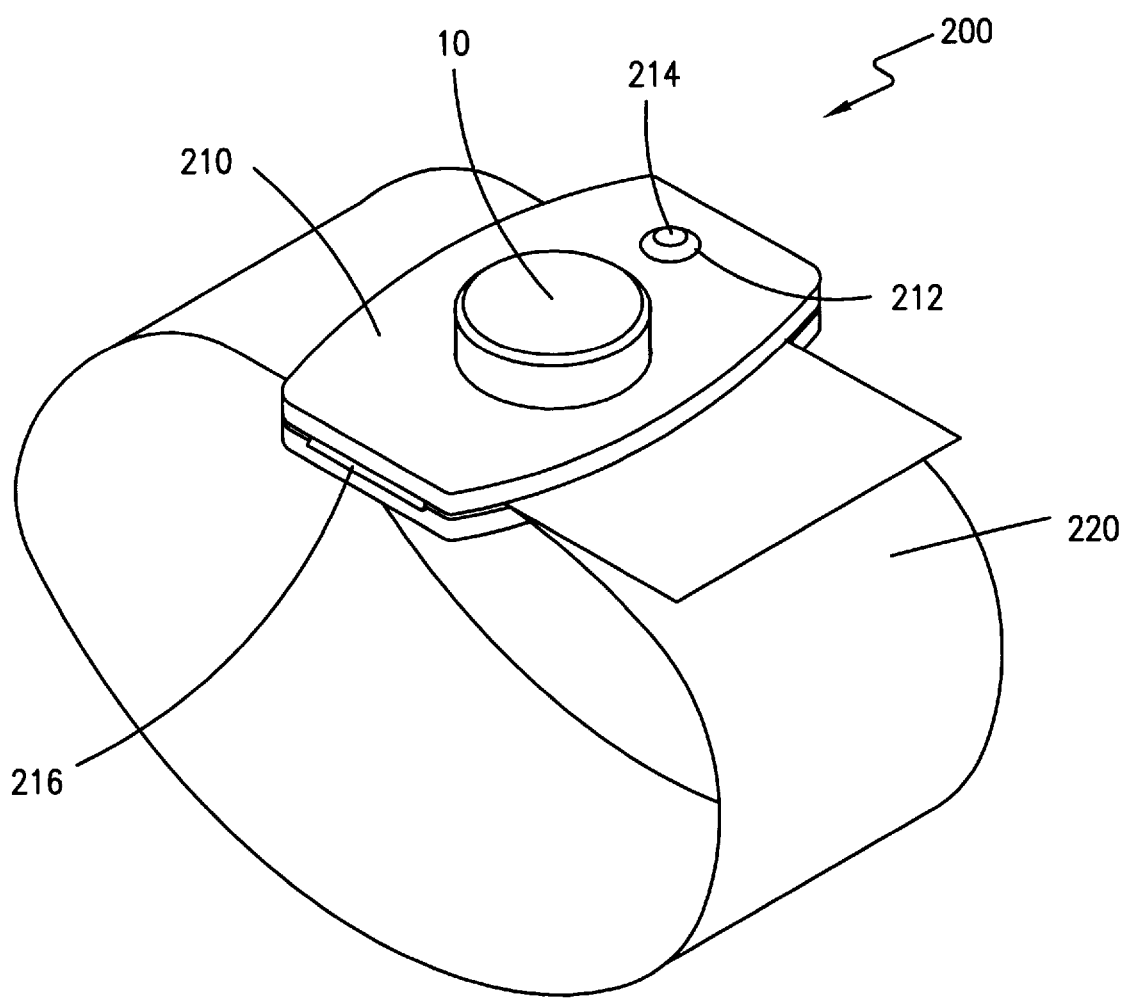
FIGS. 7A–7C is a bracelet apparatus 200 along with module placing device 210.
Figure 7B:
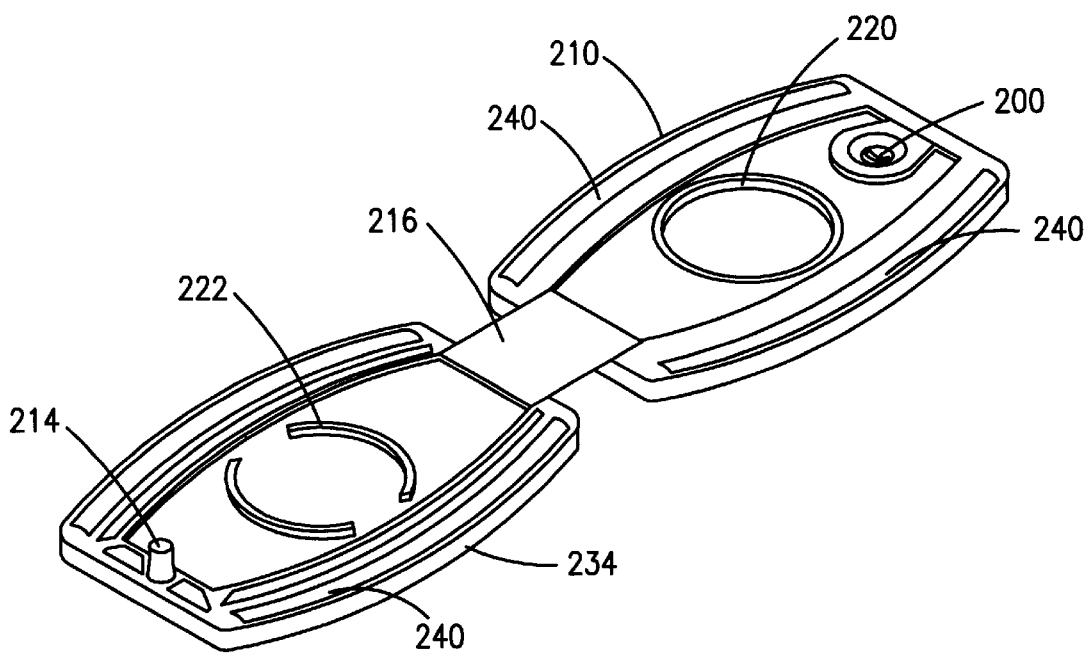
Figure 7C:
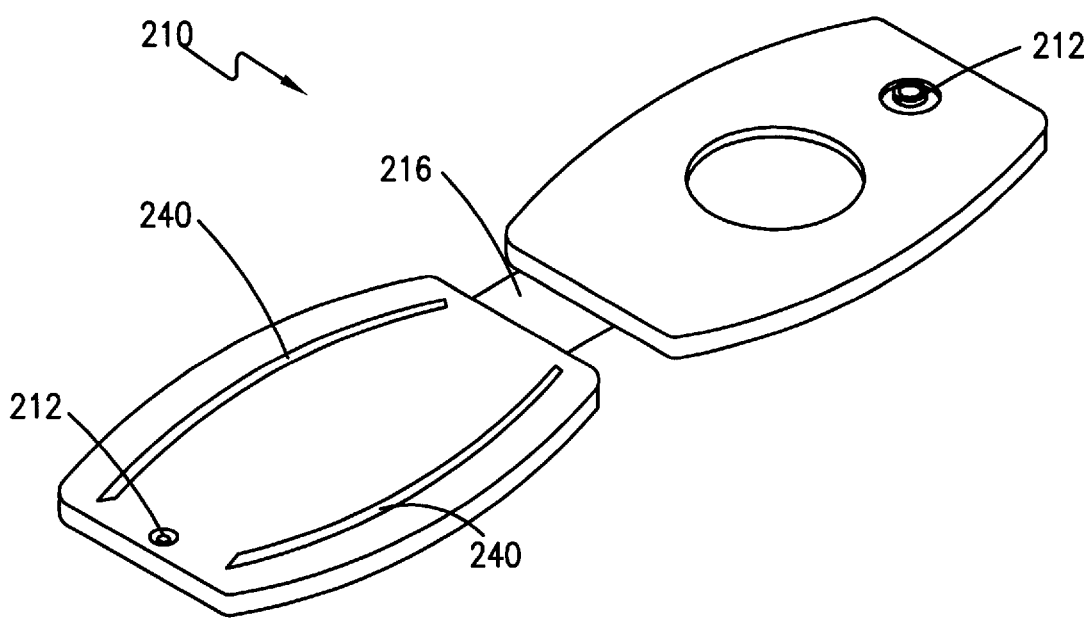

Referring to FIGS. 7A–7C, bracelet apparatus 200 is shown. More specifically, bracelet apparatus 200 is comprised of a band 205 and module placing device 210. Band 205 is preferably a relatively thin surface that is longer than it is wide and must be long enough to extend around a person's arm or leg or any other item for that matter. Band 205 is preferably comprised of a nonconductive material (e.g., plastic). Module placing device 210 is preferably comprised of plastic or other nonconductive material and is preferably made from a single mold. The module placing device 120 is bent at a preselected location 216 (e.g., in the middle, so placing device 120 is bent in half). One end or portion has a male connector 214 (portion 234) and another end or portion has a female connector 212 (portion 232), so that when placing device 120 is bent at preselected location 216—they interconnect and hold themselves together. In addition, in the approximate center of one end portion 234 of the body is at least one or more ridges 222 extending therefrom in order to hold electronic module 10 in position when placing device is properly folded. When module placing device 210 is properly folded around electronic module 10, electronic module 10 extends through opening portion 234, so that electronic module 10 can be contacted by a probe device or other accessing device, such as that shown in FIGS. 2A–2D. In addition, note grooves 240 (e.g., four in preferred embodiments), which are positioned to allow band 205 to be inserted therethrough. FIG. 7B shows the inside surface(s) of module placing device 210 when it is opened up. FIG. 7C shows the outside surface(s) of module placing device 210 when it is opened or unfolded.

Figure 7D:
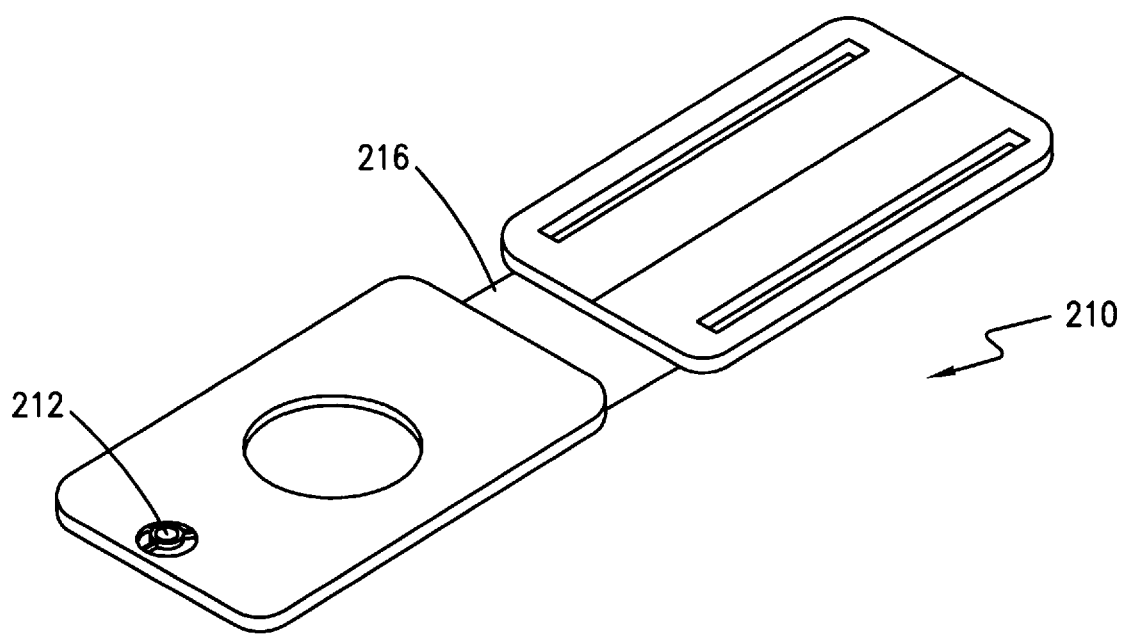
FIG. 7D is the outside surface(s) of module placing device 210 when it is opened or unfolded, module placing device 210 having fairly strait outside edges.

Note that FIG. 7D shows the outside surface(s) of module placing device 210 when it is opened or unfolded. The module placing device 210 in FIG. 7D has fairly straight outside edges, which illustrates design variations in module placing device 210 shown in FIGS. 7A–7C.

Figure 8:
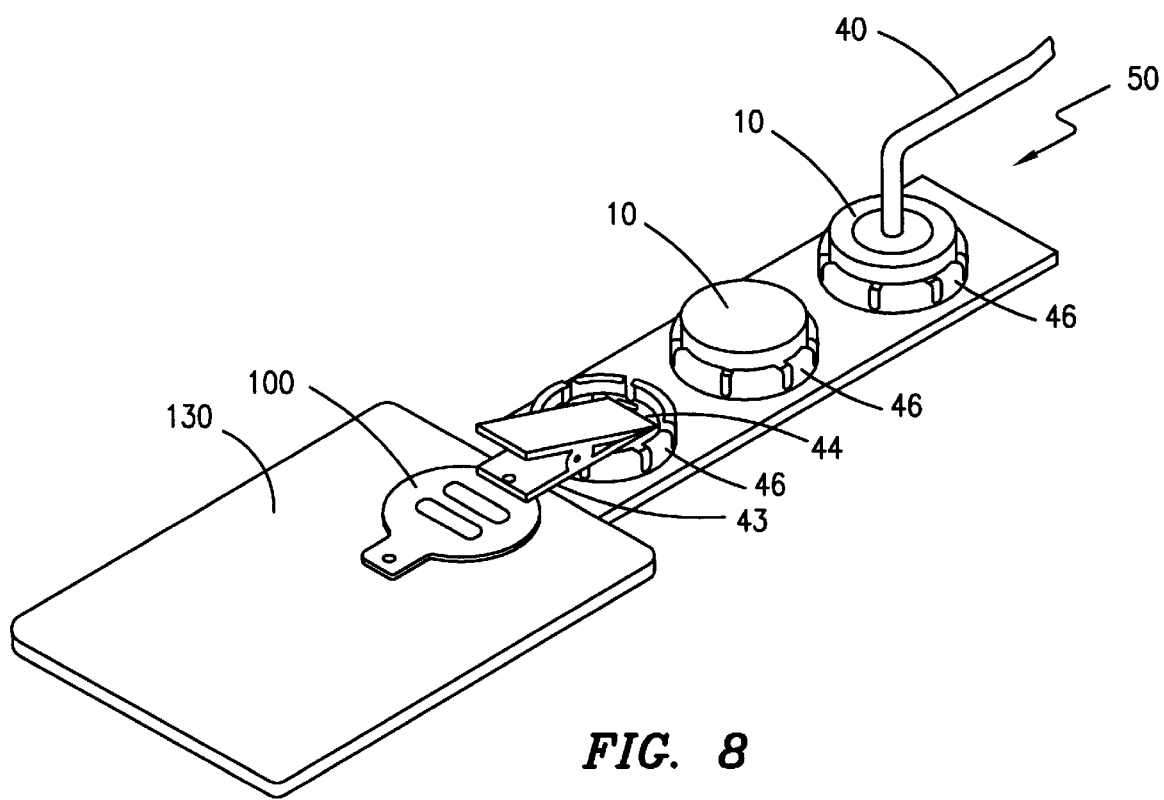
FIG. 8 is the interaction of the electronic module connector 46, electronic module 10, badge 130 and module clip 100 that were shown in more detail in the other figures and described above.

Referring to FIG. 8 shows the interaction of the electronic module connectors 44 and 46, electronic module 10, badge 130 and module clip 100 that were shown in more detail in the other figures. and described above. It is important to note that electronic module cable 40 provides electrically coupling between a host computer or similar system (not shown)—so that the overall system can be used for software authorization applications as well as security applications, as described in one or more of the patents incorporated by reference above.

FURTHER MODIFICATIONS AND VARIATIONS

Although the invention has been described with reference to a specific embodiment, this description is not meant to be construed in a limiting sense. In particular, novel aspects of the inventions described above and shown in the drawings may stand alone and/or be selectively combined in an overall system. In other words, while preferred embodiments may incorporate most or all of the features described above, alternate preferred embodiments may only incorporate only a selected number of the features, depending upon the application. As described above, various modifications of the disclosed embodiment as well as alternate embodiments of the invention will become apparent to persons skilled in the art upon reference to the description of the invention. For instance, additional conductive surface (beyond the first and second conductive surfaces/contacts disclosed) could be added to provide additional electrical contacts housed therein. Naturally, it is preferred that the additional surfaces would be insulated from one another. Accordingly, it should be understood that the modifications and variations suggested above and below are not intended to be exhaustive. These examples help show the scope of the inventive concepts, which are covered in the appended claims. The appended claims are intended to cover these modifications and alternate embodiments as well as a host of applications of this technology. In particular, the bracelet 200 described in FIGS. 7A–7D can be used in blood collection/donar applications as well as in hospital and medical environments. Similarly, the assemblies shown in FIGS. 4A–4D and 5A–5D may be used in software authorization applications. In addition, the assemblies shown in FIGS. 6A–6D can be used for employee badges, etc. The assemblies shown in FIGS. 3A–3B can be used in secured access applications, software authorization, etc. The assemblies shown in FIGS. 1A–1G and 2A–2D lend themselves to inventory control, information storage and retrieval, software authorization as well as a host of additional applications.

What is claimed is:

1. A module that houses electronic circuitry, comprising:

(a) a first electrically conductive surface;

(b) a second electrically conductive surface, said first and second electrically conductive surfaces combined to form a substantially token-shaped body, said body having a perimeter around said substantially token-shaped body, said first and second electrically conductive surfaces electrically isolated from each other, said second electrically conductive surface having a first groove positioned around the perimeter of said second surface of said substantially token-shaped body, so that a groove exists around the perimeter of said substantially token-shaped body, a portion of said second conductive surface forms a flange, said flange extends around the perimeter of said substantially token-shaped body.

2. The module of claim 1, wherein:

(a) said first electrically conductive surface comprises a first flat face of said substantially token-shaped body; and (b) said second electrically conductive surface comprises a second flat face parallel to said first flat face plus a portion of a curved surface which is perpendicular to said first flat face and said second flat face.

3. The module of claim 1, wherein said substantially token-shaped body is button-shaped.

4. The module of claim 1, wherein said substantially token-shaped body has only two electrically conductive surface areas.

5. The module of claim 1, wherein said first and second conductive surfaces are comprised of metal.

6. A module that houses electronic circuitry, comprising:

a first conductive portion;

a second conductive portion, said first conductive portion and said second conductive portion combine to form a substantially cylindrical body, a first end of said cylindrical body comprising said first conductive portion and a second end of said cylindrical body comprising said second conductive portion; and a flange, being a portion of said second conductive portion, having a first surface and a second surface, said second surface located between said first end and said second end of said cylindrical body, said flange extending radially from said cylindrical body and around the circumference of said substantially cylindrical body; and a groove about a circumference of said substantially cylindrical body.

7. The module of claim 6, further comprising an annular groove about said cylindrical body.

8. The module of claim 7, wherein said first conductive portion and said second conductive portion are electrically insulated from each other.

* * * * *